(12) United States Patent
Sasaki

(10) Patent No.: US 10,231,355 B2
(45) Date of Patent: Mar. 12, 2019

(54) COOLING STRUCTURE FOR ELECTRONIC DEVICE

(71) Applicant: FANUC CORPORATION, Yamanashi (JP)

(72) Inventor: Kazuyuki Sasaki, Yamanashi-ken (JP)

(73) Assignee: FANUC CORPORATION, Yamanashi (JP)

( * ) Notice: Subject to any disclaimer, the term of this patent is extended or adjusted under 35 U.S.C. 154(b) by 0 days.

(21) Appl. No.: 15/636,939

(22) Filed: Jun. 29, 2017

(65) Prior Publication Data

US 2018/0007810 A1    Jan. 4, 2018

(30) Foreign Application Priority Data

Jun. 30, 2016  (JP) ................................. 2016-129835

(51) Int. Cl.
*H05K 7/20* (2006.01)
*H01L 23/367* (2006.01)
(Continued)

(52) U.S. Cl.
CPC ..... *H05K 7/20154* (2013.01); *H01L 23/3675* (2013.01); *H01L 23/4006* (2013.01);
(Continued)

(58) Field of Classification Search
CPC ........... H05K 7/20154; H05K 7/20145; H05K 7/20418; H05K 7/20445; H05K 7/20409;
(Continued)

(56) References Cited

U.S. PATENT DOCUMENTS 4,483,389 A * 11/1984 Balderes ............. H01L 23/4338
165/80.3
4,765,400 A *  8/1988 Chu .................... H01L 23/4338
165/185
(Continued)

FOREIGN PATENT DOCUMENTS

FR         3049160      *  3/2016  ............... H05K 7/20
JP       05-069953 U       9/1975
(Continued)

OTHER PUBLICATIONS

Office Action in JP Application No. 2016-129835, dated Jun. 5, 2018, 7pp.

*Primary Examiner* — Dion Ferguson
*Assistant Examiner* — Amir A Jalali
(74) *Attorney, Agent, or Firm* — Hauptman Ham, LLP

(57) ABSTRACT

A cooling structure for an electronic device is configured to include internal heat dissipating fins (first heat dissipating member) accommodated inside a casing together with being disposed on a printed circuit board serving as a circuit substrate, and external heat dissipating fins (second heat dissipating member), a portion of which is exposed externally of the casing. The external heat dissipating fins include a heat input blade member which is fitted into a first heat dissipating blade member that constitutes the internal heat dissipating fins, and a second heat dissipating blade member which is exposed externally of the casing. A heat transfer part adapted to transmit heat from the heat input blade member to the second heat dissipating blade member is interposed between the heat input blade member and the second heat dissipating blade member.

20 Claims, 21 Drawing Sheets

(51) Int. Cl.
*H01L 23/40* (2006.01)
*H01L 23/433* (2006.01)
*H01L 23/467* (2006.01)

(52) U.S. Cl.
CPC ....... *H01L 23/433* (2013.01); *H05K 7/20145* (2013.01); *H05K 7/20418* (2013.01); *H05K 7/20445* (2013.01); *H01L 23/467* (2013.01); *H01L 2924/0002* (2013.01)

(58) Field of Classification Search
CPC .......... H05K 7/20136; H05K 7/20436; H05K 7/209; H05K 7/20909; H05K 7/20954–7/20963; H01L 23/3675; H01L 23/4006; H01L 23/367; H01L 2924/0002; G06F 1/20; G06F 1/181; G02F 1/133382–1/133385
USPC .......................... 361/702–704, 720, 679, 21; 257/712–713
See application file for complete search history.

(56) References Cited

U.S. PATENT DOCUMENTS

| | | | | |
|---|---|---|---|---|
| 4,770,242 A | * | 9/1988 | Daikoku | H01L 23/4338 165/185 |
| 4,800,956 A | * | 1/1989 | Hamburgen | H01L 23/4338 165/185 |
| 5,014,117 A | * | 5/1991 | Horvath | H01L 23/4338 165/185 |
| 5,345,107 A | * | 9/1994 | Daikoku | F28F 13/00 165/185 |
| 5,515,912 A | * | 5/1996 | Daikoku | H01L 23/4338 165/185 |
| 5,774,334 A | * | 6/1998 | Kawamura | H01L 23/4338 165/80.4 |
| 5,969,942 A | * | 10/1999 | Heckner | H05K 7/207 165/121 |
| 2008/0190587 A1 | * | 8/2008 | Lin | F28D 15/0233 165/104.21 |
| 2009/0101324 A1 | * | 4/2009 | Chu | H01L 23/367 165/185 |
| 2009/0229808 A1 | * | 9/2009 | Chu | F28F 3/06 165/185 |
| 2012/0293952 A1 | * | 11/2012 | Herring | H01L 23/367 361/679.54 |
| 2014/0000105 A1 | * | 1/2014 | Bielick | H05K 13/0486 29/829 |
| 2014/0210072 A1 | * | 7/2014 | Tsukamoto | H01L 23/367 257/717 |
| 2016/0178289 A1 | * | 6/2016 | Gonzalez | G06F 1/20 165/80.3 |

FOREIGN PATENT DOCUMENTS

| | | |
|---|---|---|
| JP | S58-105190 U | 7/1983 |
| JP | 05-069953 U | 9/1993 |
| JP | H10-173114 A | 6/1998 |
| JP | 2006-245356 A | 9/2006 |
| JP | 2009295626 A | 12/2009 |

* cited by examiner

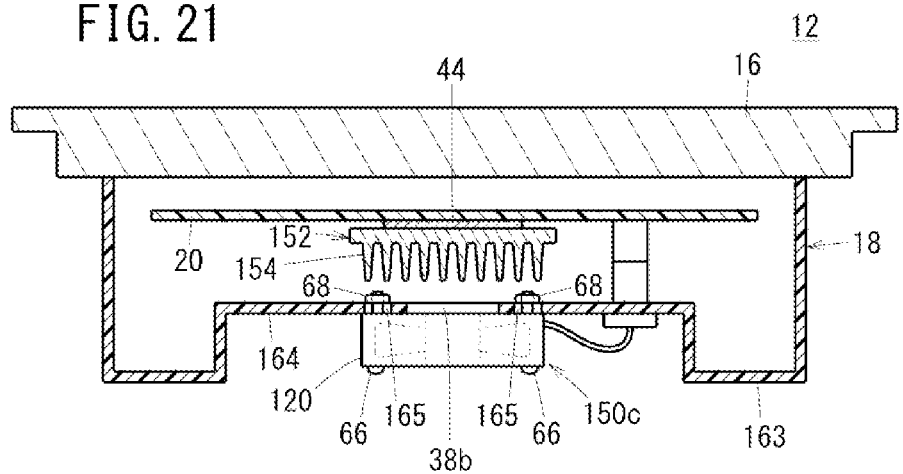

COOLING STRUCTURE FOR ELECTRONIC DEVICE

CROSS-REFERENCE TO RELATED APPLICATION

This application is based upon and claims the benefit of priority from Japanese Patent Application No. 2016-129835 filed on Jun. 30, 2016, the contents of which are incorporated herein by reference.

BACKGROUND OF THE INVENTION

Field of the Invention

The present invention relates to a cooling structure for an electronic device for cooling a circuit substrate accommodated inside a casing.

Description of the Related Art

An electronic device, for example, is incorporated in a control panel for a machine tool, and is used as a numerical control device. This type of electronic device is constituted by accommodating in the interior of a casing a circuit substrate on which electronic components such as capacitors, transistors, electromagnetic coils, etc., are provided. In addition, during usage thereof, current is supplied to the electronic components, accompanied by the electronic components taking on heat. In order to dissipate such heat so as to avoid a rise in temperature, for example, as disclosed in Japanese Laid-Open Patent Publication No. 2009-295626, together with providing a heat dissipating member on the circuit substrate, a cooling fan is disposed in the casing to supply cooling air to the heat dissipating member.

Further, in Japanese Laid-Open Utility Model Publication 05-069953, a cooling structure is proposed in which two individual heat dissipating members are stacked. In this case, since a driving mechanism for rotating a cooling fan is rendered unnecessary, an advantage is achieved in that the structure can be simplified.

SUMMARY OF THE INVENTION

With the conventional technology disclosed in Japanese Laid-Open Utility Model Publication No. 05-069953, a plurality of ring-shaped blade members are arranged concentrically in lower and upper heat dissipating members, and the lower heat dissipating member and the upper heat dissipating member are connected by screws. More specifically, female screw threads are provided on the ring-shaped blade members of the lower heat dissipating members, whereas a plurality of male screw members are formed to project out concentrically on a lower end surface of the upper heat dissipating members. In addition, the male screw members are engaged with the female screw threads.

However, providing the plurality of male screw members and female screw threads in a concentric manner as described above is accompanied by a high degree of machining. For example, when threads are engraved, or stated otherwise, when forming spiral grooves on the inner annular protrusions, it is necessary to consider that the machining tool may interfere with the outer annular protrusions (male screw members).

Further, in this case, a clearance is formed between the inner circumferential walls of the male screw members and the outer circumferential walls of the annular shaped blade members located on the inner side thereof. Due to the existence of such a clearance, transfer of heat from the lower heat dissipating member to the upper heat dissipating member is hindered. For this reason, it is not easy to efficiently remove heat from the electronic components or the circuit substrate.

A principal object of the present invention is to provide a cooling structure for an electronic device, which has a simple configuration and is superior in terms of heat dissipation efficiency.

According to an embodiment of the present invention, a cooling structure for an electronic device is provided, which is configured to include a first heat dissipating member accommodated inside a casing together with being disposed on a circuit substrate, and a second heat dissipating member adapted to dissipate heat transmitted from the first heat dissipating member to the exterior of the casing, wherein:

the first heat dissipating member includes a first heat dissipating blade member; and the second heat dissipating member includes a heat input blade member which is fitted into the first heat dissipating blade member, a second heat dissipating blade member which is exposed externally of the casing, and a heat transfer part interposed between the heat input blade member and the second heat dissipating blade member, and which is adapted to transmit heat from the heat input blade member to the second heat dissipating blade member.

More specifically, in the present invention, the heat generated in the circuit substrate is initially transmitted to the first heat dissipating member, and further is transmitted from the first heat dissipating member to the second heat dissipating member. Thereafter, the heat is dissipated from the second heat dissipating member to the exterior of the casing.

In this instance, the first heat dissipating member includes the first heat dissipating blade member, and the heat input blade member of the second heat dissipating member is fitted into the first heat dissipating blade member. The shape of the heat input blade member conforms to the shape of the first heat dissipating blade member, and therefore, the blades of both blade members are placed favorably in close contact with each other from the vicinity of the top portions of crests to the vicinity of bottom portions of valleys thereof. More specifically, it is possible to avoid the formation of a clearance that inhibits transfer of heat between the first heat dissipating blade member that supplies heat, and the heat input blade member to which such heat is supplied.

Consequently, heat that is supplied to the first heat dissipating member is transmitted highly efficiently from the first heat dissipating member to the second heat dissipating member. Stated otherwise, it is possible to efficiently remove the heat generated in the circuit substrate. Or in other words, while the cooling structure for the electronic device is of a simple configuration, it is superior in terms of heat dissipation efficiency.

The first heat dissipating blade member can be constructed such that the blades thereof extend in a horizontal direction. In this case, a projecting length of the blades preferably is set to be greater in a vertical upward location than in a vertical downward location. With such a configuration, when an upward airflow from the bottom occurs in the casing, it is possible for a portion of the airflow to contact the lower blades, whereas the remainder of the airflow contacts the upper blades. Consequently, the airflow can be brought into contact with the entirety of the first heat dissipating blade member and thereby cool the first heat dissipating blade member.

The first heat dissipating blade member, the heat input blade member, and the second heat dissipating blade member preferably extend in the same direction. Although the first heat dissipating member and the second heat dissipating member are manufactured, for example, by extrusion molding, if the directions in which the heat input blade member and the second heat dissipating blade member are the same, both blade members can be formed by a single extrusion process. This is because the direction of extrusion is the direction in which the blades extend. In other words, it becomes particularly easy to manufacture the second heat dissipating member.

In addition, if the directions in which the heat input blade member and the first heat dissipating blade member extend are aligned, it is easy for both of the blade members to be fitted together.

Further, the second heat dissipating member preferably is supported by the casing. In this case, the weight of the second heat dissipating member itself and the external force acting on the second heat dissipating member are transmitted to the casing. In other words, the casing receives the weight of the second heat dissipating member and the external force. As a result, it is possible to reduce the load that acts on the first heat dissipating member provided on the circuit substrate, and thus it is possible to eliminate the possibility of damage to the electronic components and the like.

In this case, there may further be provided a position adjusting member which is capable of moving the relative positioning of the second heat dissipating member with respect to the first heat dissipating member in the casing. Consequently, even in a state in which the second heat dissipating member is supported by the casing, owing to the existence of the position adjusting member, it is possible to precisely align the first heat dissipating blade member and the heat input blade member by adjusting the mounting position of the casing.

Stated otherwise, by providing the position adjusting member, the mounting position of the casing can be adjusted up to a position where the first heat dissipating blade member and the heat input blade member are suitably fitted together. Consequently, for example, even if manufacturing errors occur in the first heat dissipating blade member and the heat input blade member, or further, even if there are errors in the mounting position of the circuit substrate, or dimensional errors in the casing, etc., the first heat dissipating blade member and the heat input blade member can easily be fitted together.

An elongate hole may be offered as a suitable example of the position adjusting member. In this case, a screw for attaching the casing to a predetermined member is passed through the elongate hole. At this time, the mounting position of the casing can be arbitrarily adjusted by moving the position where the screw passes along the direction of extension of the elongate hole.

A ventilation opening for dissipating heat may be formed in the casing. In this case, preferably, the number of individual ventilation openings can be set arbitrarily. For this purpose, removable parts may be disposed in the casing. More specifically, the ventilation openings are formed by removal of the removable parts from the casing.

For example, in the case that the amount of heat to be dissipated is small, it is not particularly necessary to remove the removable parts. On the other hand, in the case that the amount of heat to be dissipated is large, by removal of the removable parts, ventilation openings are created by the remnants of the removal thereof. As a result, heat is dissipated through the ventilation openings.

A detachment tool may further be included, which is adapted to press the heat input blade member in a direction to separate and detach it away from the first heat dissipating blade member. As a result of such a pressing action, it becomes easy to release the state of engagement between the heat input blade member and the first heat dissipating blade member. Accordingly, for example, maintenance and inspection work can easily be performed.

The detachment tool can be constituted, for example, by a flange that protrudes outwardly in a diametrical direction, and which is provided on a shank portion of an attachment screw for attaching the second heat dissipating member to the first heat dissipating member. In this case, the flange is positioned between the first heat dissipating blade member and the heat input blade member. In addition, when the attachment screw is screw-rotated in a direction away from the screw hole, the flange presses the heat input blade member in a direction to separate away from the first heat dissipating blade member. As a result of such a pressing action, the state of engagement between the heat input blade member and the first heat dissipating blade member is released.

A lever member may be offered as another example of the detachment tool. In this case, the lever member may be inserted between the first heat dissipating blade member and the heat input blade member, and thereafter, the lever member may be operated so that the lever member presses the heat input blade member in a direction to separate away from the first heat dissipating blade member.

Further, a leg part preferably is provided that abuts against the circuit substrate and which is supported on the circuit substrate. In this case, since the weight of the second heat dissipating member itself and the external force acting thereon are distributed, it is possible to further reduce the load acting on the electronic components.

On the other hand, a support member may be provided in the interior of the casing, and the second heat dissipating member may be supported by the support member. In this case, the weight of the second heat dissipating member itself, and the external force acting thereon also are distributed to the support member. Consequently, in the same manner as described above, it is possible to reduce the load acting on the electronic components.

Furthermore, a heat pipe may be provided in the heat transfer part that makes up the second heat dissipating member. In this case, the speed at which heat is transmitted from the heat input blade member to the second heat dissipating blade member via the heat transfer part is increased. Accordingly, it is possible to more quickly eliminate heat that is generated in the circuit substrate.

In the above structure, the second heat dissipating member is capable of being detached from the casing, and a cooling fan, which is lighter in weight than the second heat dissipating member, preferably can be disposed at a placement location of the second heat dissipating member. In this case, the means for dissipating heat is capable of being modified appropriately. More specifically, a desired type of heat dissipating means can be installed in the casing in accordance with the amount of heat to be dissipated, and a reduction in weight of the electronic device.

According to the present invention, the first heat dissipating blade member that constitutes the first heat dissipating member, and the heat input blade member that constitutes the second heat dissipating member are fitted together. Therefore, heat that is supplied to the first heat dissipating member is transmitted highly efficiently to the second heat dissipating member through the first heat dissipating blade member and the heat input blade member. Furthermore, such heat moves to the second heat dissipating blade member of the second heat dissipating member. Since the second heat dissipating blade member is exposed to the exterior of the casing, heat from the second heat dissipating blade member is dissipated swiftly externally of the casing.

In the foregoing manner, by adopting the structure described above, heat generated in a circuit substrate accommodated in the interior of a casing can quickly be removed. More specifically, although being of a simple configuration, a cooling structure for an electronic device which is superior in terms of heat dissipation efficiency can be obtained.

The above and other objects, features, and advantages of the present invention will become more apparent from the following description when taken in conjunction with the accompanying drawings, in which a preferred embodiment of the present invention is shown by way of illustrative example.

BRIEF DESCRIPTION OF THE DRAWINGS

FIG. 21 is a cross-sectional view taken along line XXI-XXI in FIG. 19.

DESCRIPTION OF THE PREFERRED EMBODIMENTS

Preferred embodiments of a cooling structure for an electronic device according to the present invention will be described in detail below with reference to the accompanying drawings. In the following description, the cooling structure for an electronic device may be referred to simply as a "cooling structure". Further, the term "front surface" refers to a display surface side of the display, whereas the term "rear surface" refers to a rear surface side of the display. Furthermore, the terms "lower" and "upper" correspond to the lower side and the upper side in the respective perspective views, as well as in the respective side surface vertical cross-sectional views, the respective front views, and the respective rear views.

Initially, a first embodiment in relation to a structure for placement of a second heat dissipating member on an upper surface of a casing will be described.

Figure 1:
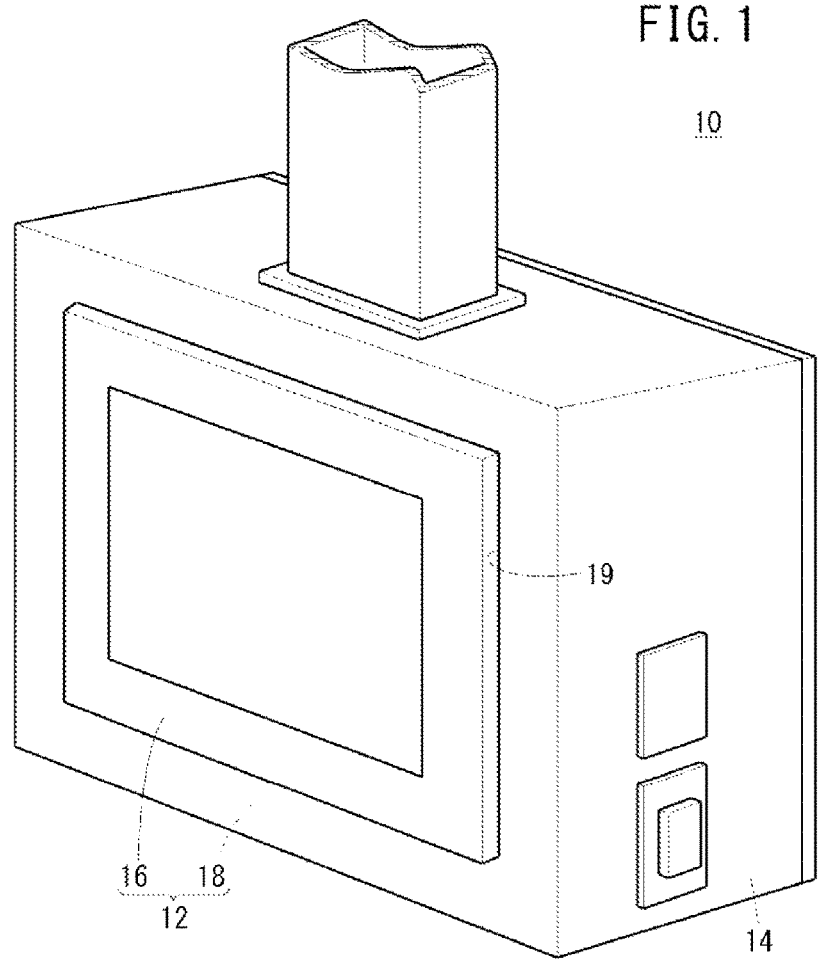
FIG. 1 is a schematic perspective view of principal components of a control panel for controlling operations of a machine tool.
Figure 2:
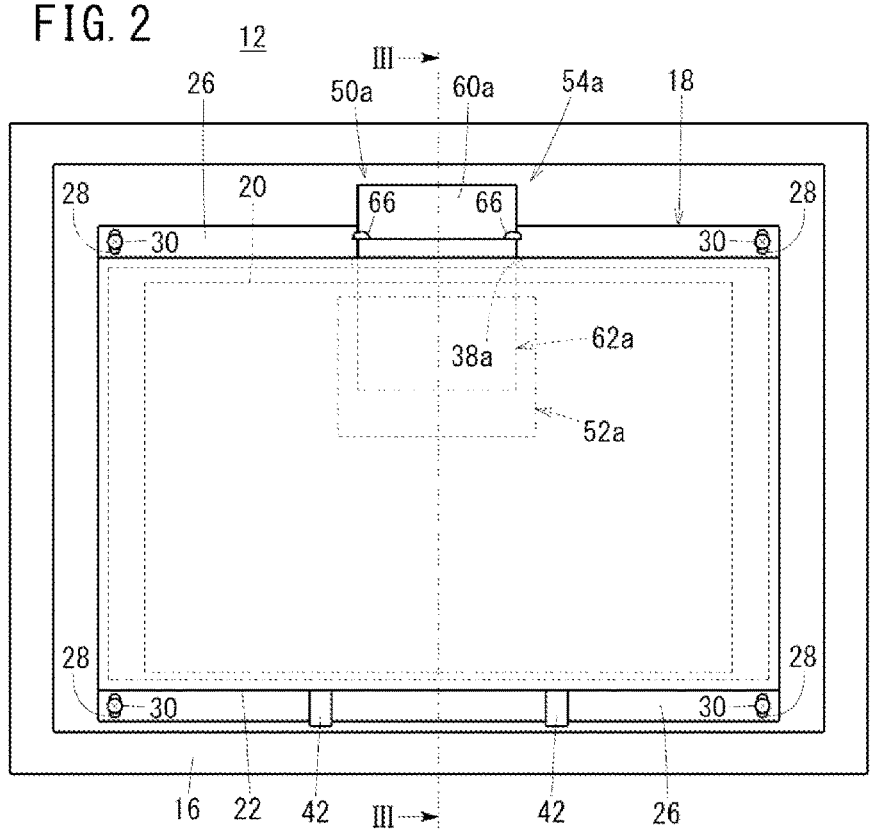
FIG. 2 is a schematic rear view of an electronic device constituting the control panel of FIG. 1, and in which a cooling structure according to a first embodiment is provided.
Figure 3:
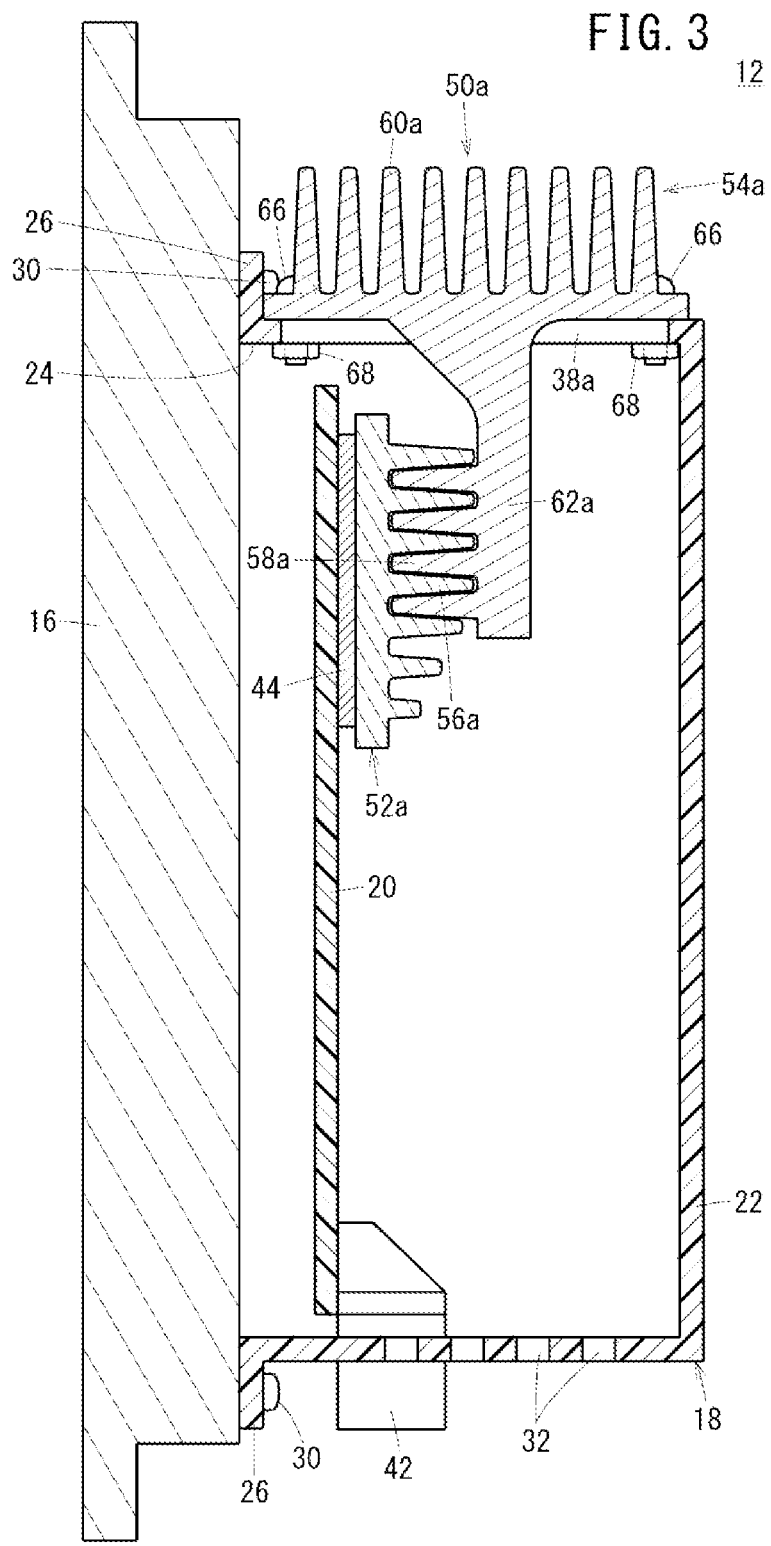
FIG. 3 is a cross-sectional view taken along line III-III in FIG. 2.
Figure 4:
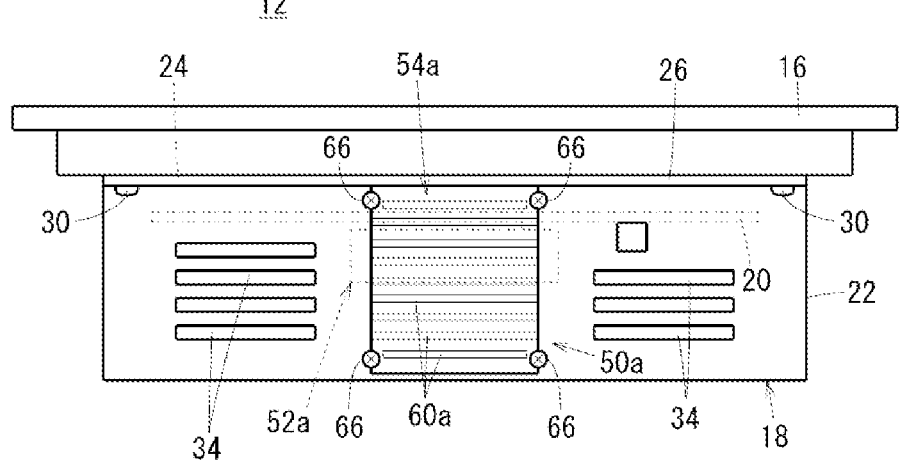
FIG. 4 is a schematic plan view of the electronic device of FIG. 2.

FIG. 1 is a schematic perspective view of principal components of a control panel 10 for controlling operations of a non-illustrated machine tool. The control panel 10 includes an electronic device 12 and a housing 14. In this case, the electronic device 12 is made up from a display 16, and a control unit 18 as shown in FIGS. 2 through 4. A portion of the display 16 is exposed from an opening 19 formed in a front surface of the housing 14, while the remainder thereof is accommodated together with the control unit 18 in the interior of the housing 14.

FIGS. 2 through 4 are a schematic rear view, a cross-sectional view taken along line III-III in FIG. 2 (side cross-sectional view), and a schematic plan view of the electronic device 12. The control unit 18 includes a substantially rectangular parallelepiped shaped casing 22 in which a printed circuit board 20 (circuit substrate) is accommodated. An opening 24 is formed in the casing 22 on a side thereof facing toward the rear surface of the display 16, and the opening 24 is closed by a rear surface of the display 16.

Non-illustrated female screw threads are formed on the rear surface of the display 16. On the other hand, at vertically upward and vertically downward positions of the opening 24, protruding edge portions 26 are formed to protrude, respectively, and in corners of such edge portions 26, elongate mounting holes 28 (elongate holes), which serve as position adjusting members, are formed therein extending along the vertical direction. Male screws which serve as fixing screws 30 are inserted through the elongate mounting holes 28 and are screw-engaged with the female screw threads.

A plurality of lower surface side ventilation openings 32 (see FIG. 3) open on a lower surface (bottom wall) of the casing 22. Further, as shown in FIG. 4, upper surface side ventilation openings 34 open on the upper surface of the casing 22. As will be described in detail later, the upper surface side ventilation openings 34 are formed by removal of removable parts 36 (see FIG. 14) from the upper surface.

Further, an installation hole 38a (see FIG. 2) opens on an upper surface at a position surrounded by the upper surface side ventilation openings 34. Furthermore, in the vicinity of the installation hole 38a, four installation screw holes which serve as through holes (none of which are shown) are formed in the vicinity of the installation hole 38a.

The printed circuit board 20, which is disposed in the interior of the casing 22, is supported by support pedestals 41 (see FIG. 18) provided on the rear surface of the display 16. By being supported in this manner, the printed circuit board 20 is maintained at an upstanding posture in the interior of the casing 22. The support pedestals 41 are not otherwise shown except for the features thereof shown in FIG. 18.

The printed circuit board 20 is a printed substrate on which non-illustrated conductive paths are printed, and various electronic components such as capacitors, resistors, an electromagnetic coil, transistors, diodes (none of which are shown), and a semiconductor chip 44 (see FIG. 3) or the like are attached at predetermined positions of the conductive paths. Reception of signals and driving currents with respect to these electrical components are carried out through a harness (not shown), which is connected electrically to an input/output connector 42.

As shown in FIGS. 2 through 4, a cooling structure 50a according to the first embodiment is disposed with respect to the electronic device 12 which is constructed in the manner described above. More specifically, the cooling structure 50a includes internal heat dissipating fins 52a (first heat dissipating member) and external heat dissipating fins 54a (second heat dissipating member). The internal heat dissipating fins 52a are arranged in the vicinity of the upper end of the printed circuit board 20, and the entirety thereof is accommodated inside the casing 22.

The internal heat dissipating fins 52a include a first heat dissipating blade member 56a made up from a plurality of blades. In the first embodiment, the first heat dissipating blade member 56a extends along a horizontal direction (a widthwise direction of the casing 22). Further, the projecting length of the blades that constitute the first heat dissipating blade member 56a is set to be greater on a vertical upper side than on a vertical downward side of the first heat dissipating blade member 56a. The projecting length may be changed gradually, or may be changed in a stepwise manner. In FIG. 3, a case is exemplified in which the projecting length becomes greater in a stepwise manner from below, and is set to be constant from substantially a middle location in the vertical direction.

The internal heat dissipating fins 52a, which are constituted in the foregoing manner, are supported on the printed circuit board 20 and placed in abutment against the semiconductor chip 44.

On the other hand, the external heat dissipating fins 54a include a heat input blade member 58a, a second heat dissipating blade member 60a, and a heat transfer part 62a which is interposed between the heat input blade member 58a and the second heat dissipating blade member 60a. Among these elements, the heat input blade member 58a has a shape that corresponds (conforms) to the shape of the first heat dissipating blade member 56a that constitutes the internal heat dissipating fins 52a. Therefore, the first heat dissipating blade member 56a and the heat input blade member 58a are fitted together mutually in close contact. More specifically, the formation of a clearance between the first heat dissipating blade member 56a and the heat input blade member 58a is avoided.

A heat conductive sheet or heat conductive grease may be interposed between the blades of the first heat dissipating blade member 56a and the blades of the heat input blade member 58a. This is because, owing thereto, thermal resistance is reduced between the first heat dissipating blade member 56a and the heat input blade member 58a.

It is not particularly necessary for all of the blades of the heat input blade member 58a and the first heat dissipating blade member 56a to be fitted together. For example, in the case that the number of blades of the heat input blade member 58a is smaller than the number of blades of the first heat dissipating blade member 56a, the heat input blade member 58a need not be fitted to a portion of the first heat dissipating blade member 56a.

Further, there is no particular need for the width dimensions (in a horizontal direction) of the first heat dissipating blade member 56a and the heat input blade member 58a to coincide with each other. More specifically, as shown in FIG. 3, the width dimension of the first heat dissipating blade member 56a may be greater in comparison with that of the heat input blade member 58a, or vice versa.

The heat transfer part 62a forms a heat transfer path when heat transmitted to the heat input blade member 58a from the first heat dissipating blade member 56a moves to the second heat dissipating blade member 60a. In this manner, the heat transfer part 62a carries out a function of transferring heat supplied to the heat input blade member 58a to the second heat dissipating blade member 60a.

In contrast to the heat input blade member 58a and the heat transfer part 62a being accommodated in the interior of the casing 22, the second heat dissipating blade member 60a is exposed to the exterior of the casing 22. More specifically, in contrast to the heat transfer part 62a being passed through the installation hole 38a, the second heat dissipating blade member 60a is blocked by the upper surface (see FIGS. 2 and 3). This is because a depth (in a direction from a front surface to the back surface) of the installation hole 38a is substantially equivalent to the depth dimension of the heat transfer part 62a, yet is smaller than the depth dimension of the second heat dissipating blade member 60a.

The second heat dissipating blade member 60a is of a substantially rectangular shape as viewed in plan, and the width dimension of the blades at the most frontward and most rearward locations are set to be smaller in comparison with the other blades (see FIG. 4). Therefore, the second heat dissipating blade member 60a has a shape in which flat portions are provided at the four corners thereof. Screw insertion holes (not shown) that extend in a vertical direction are formed in the flat portions. Nuts 68 are screw-engaged with threaded portions of installation screws 66, which are passed through the screw insertion holes and the installation screw holes.

Owing thereto, the external heat dissipating fins 54a are mounted on the casing 22, and as a result, are supported by the casing 22. More specifically, a portion of the weight of the external heat dissipating fins 54a acts as a weight (load) with respect to the upper surface of the casing 22.

The directions in which the heat input blade member 58a and the second heat dissipating blade member 60a extend are in a horizontal direction (width direction) in the same manner as the first heat dissipating blade member 56a. Stated otherwise, the first heat dissipating blade member 56a, the heat input blade member 58a, and the second heat dissipating blade member 60a extend in the same direction.

The cooling structure 50a according to the first embodiment is constructed basically in the manner described above. Next, operations and effects of the cooling structure 50a will be described.

The internal heat dissipating fins 52a are manufactured by carrying out extrusion molding on a workpiece made from an aluminum alloy. At this time, the first heat dissipating blade member 56a is molded so as to extend along the direction of extrusion. In a similar manner, the other external heat dissipating fins 54a also are manufactured by carrying out extrusion molding on a workpiece made from an aluminum alloy. According to the present embodiment, the heat input blade member 58a and the second heat dissipating blade member 60a are molded at the same time by a one-time extrusion. In particular, as shown in FIG. 3, this is because, since the heat input blade member 58a and the second heat dissipating blade member 60a both extend in the same direction (horizontal direction), the heat input blade member 58a and the second heat dissipating blade member 60a may be molded so as to extend in the same direction as the direction of extrusion.

The obtained heat input blade member 58a and the heat transfer part 62a of the external heat dissipating fins 54a are passed in this order from the exterior toward the interior of the installation hole 38a of the casing 22. In addition, after the installation screws 66 have been passed through the screw insertion holes formed in the flat portions in the four corners of the external heat dissipating fins 54a, and the installation screw holes formed in the casing 22, the nuts 68 are screw-engaged with the threaded portions thereof. As a result, the external heat dissipating fins 54a are attached to the casing 22 in a state with the second heat dissipating blade member 60a being exposed to the exterior of the casing 22. Consequently, the casing 22 receives and bears the weight of the external heat dissipating fins 54a.

The other internal heat dissipating fins 52a are supported on the printed circuit board 20 through the semiconductor chip 44. Furthermore, the printed circuit board 20 is arranged in an upstanding manner in the interior of the casing 22 as a result of being supported on the support pedestals 41. Consequently, the printed circuit board 20 is supported on the display 16 through the support pedestals 41. Further, the first heat dissipating blade member 56a is fitted into the heat input blade member 58a. Since the directions in which the first heat dissipating blade member 56a and the heat input blade member 58a extend are the same, both members can be fitted together easily. In other words, construction of the cooling structure 50a is easily performed.

As may be necessary, before attaching the external heat dissipating fins 54a and the printed circuit board 20 to the casing 22, or following attachment thereof, a predetermined number of the removable parts 36 formed in the casing 22 are removed manually or with a punching process or the like. In this instance, the removable parts 36 are defined by sites surrounded by inverted U-shaped notches 70, two straight line shaped notches 72, 72, and U-shaped notches 74 (see FIG. 14). For example, when an external force is applied to the sites between the straight line shaped notches 72, 72, cracks are propagated between the inverted U-shaped notches 70 and the straight line shaped notches 72, 72, as well as between the straight line shaped notches 72, 72 and the U-shaped notches 74. As a result, the inverted U-shaped notches 70 and the U-shaped notches 74 are connected and joined via the straight line shaped notches 72, 72 and cracks. Consequently, the upper surface side ventilation openings 34 are formed.

Next, the casing 22 is mounted on the rear surface of the display 16. More specifically, the fixing screws 30 are passed through predetermined locations of the elongate mounting holes 28, and are screw-engaged with the female screw threads formed on the rear surface of the display 16. By passing the fixing screws through the elongate mounting holes 28 and moving the fixing screws 30 along the directions in which the elongate mounting holes 28 extend, it is possible to set the vertical (upper and lower) positioning of the casing 22. More specifically, it is possible to adjust the mounting position of the casing 22 with respect to the rear surface of the display 16.

Accompanying movement of the casing 22 in a vertical direction, the external heat dissipating fins 54a placed on the upper surface of the casing 22 are moved together with the casing 22. Therefore, the positioning of the heat input blade member 58a of the external heat dissipating fins 54a with respect to the first heat dissipating blade member 56a of the internal heat dissipating fins 52a changes. Consequently, the mutual relative positioning therebetween can be adjusted until the first heat dissipating blade member 56a and the heat input blade member 58a are fitted together. More specifically, positioning and alignment of the first heat dissipating blade member 56a and the heat input blade member 58a can be carried out with high precision.

In this case, the electronic device 12 is incorporated in the control panel 10 for a machine tool, and is used as an operations controller (numerical control device). During usage thereof, current is supplied to the electronic components, accompanied by the electronic components and the printed circuit board 20 taking on heat. Such heat is transferred to the internal heat dissipating fins 52a from the printed circuit board 20 (including the semiconductor chip 44).

In this instance, the above-described heat input blade member 58a of the external heat dissipating fins 54a is fitted into the first heat dissipating blade member 56a of the internal heat dissipating fins 52a. More specifically, a clearance that would hinder transfer of heat is not formed, and the blades of both blade members 56a, 58a are placed in close contact with each other from the vicinity of the top portions of crests to the vicinity of bottom portions of valleys thereof. Therefore, heat is transferred efficiently from the first heat dissipating blade member 56a to the heat input blade member 58a. Stated otherwise, input of heat is carried out efficiently with respect to the external heat dissipating fins 54a. When a heat conductive sheet or heat conductive grease or the like is interposed between the first heat dissipating blade member 56a and the heat input blade member 58a, input of heat can be performed even more efficiently.

The heat is transferred to the second heat dissipating blade member 60a via the heat transfer part 62a of the external heat dissipating fins 54a. Since the second heat dissipating blade member 60a is exposed on the exterior of the casing 22, such heat is dissipated from the second heat dissipating blade member 60a. Through the process described above, the heat from the printed circuit board 20 is removed.

In the forgoing manner, by way of the cooling structure 50a according to the first embodiment, the heat input blade member 58a of the external heat dissipating fins 54a is fitted (the blades of both blade members 56a, 58a are placed in close contact) with respect to the first heat dissipating blade member 56a of the internal heat dissipating fins 52a, which are accommodated inside the casing 22. Together therewith, by the second heat dissipating blade member 60a of the external heat dissipating fins 54a being exposed externally of the casing 22, dissipation of heat, or stated otherwise, removal of heat that is generated in the printed circuit board 20, can be carried out efficiently. In addition, construction of the cooling structure 50a is easily implemented.

Further, by removal of the above-described removable parts 36, the upper surface side ventilation openings 34 are formed on the upper surface of the casing 22. The upper surface side ventilation openings 34 also provide an outlet for heat to the exterior of the casing 22. Consequently, the heat dissipation effect can be enhanced. In this manner, according to the first embodiment, by removal of the removable parts 36 and forming the upper surface side ventilation openings 34, it becomes possible to adjust the degree at which heat is dissipated. More specifically, for example, when it is necessary to dissipate a large amount of heat, the number of removable parts 36 that are removed (the number of upper surface side ventilation openings 34 that are formed) may be increased, or conversely, if the heat to be dissipated is small, the number of removable parts 36 that are removed (the number of upper surface side ventilation openings 34 that are formed) may be reduced.

Furthermore, by moving the position at which the fixing screws 30 are inserted with respect to the elongate mounting holes 28 of the casing 22, and thereby moving the attachment position of the casing 22 with respect to the rear surface of the display 16, it is possible to adjust the relative positioning of the heat input blade member 58a with respect to the first heat dissipating blade member 56a.

For example, at a time that manufacturing errors occur in the first heat dissipating blade member 56a and the heat input blade member 58a, or further, if there are errors in the mounting position of the printed circuit board 20, or dimensional errors in the casing 22, etc., as described above, the relative positioning of the heat input blade member 58a with respect to the first heat dissipating blade member 56a may be suitably adjusted, and the first heat dissipating blade member 56a and the heat input blade member 58a may be adjusted to positions where they are fitted together mutually. In this manner, by formation of the elongate mounting holes 28, the positioning and alignment between the first heat dissipating blade member 56a and the heat input blade member 58a can be carried out with high precision.

In addition, with the cooling structure 50a, the external heat dissipating fins 54a are supported by the upper surface of the casing 22. Consequently, the weight of the external heat dissipating fins 54a itself acts on the casing 22. Further, even if an external force is applied that presses the second heat dissipating blade member 60a from an upper side toward a lower side thereof, the external force is distributed to the casing 22. Consequently, the weight of the external heat dissipating fins 54a or the external force can be alleviated.

Next, a description will be made concerning modifications of the first embodiment. As necessary, reference numerals with alphabetical characters appended thereto are used to denote structural elements that correspond with structural elements of the cooling structure 50a shown in FIGS. 1 through 4, and detailed description of such features is omitted.

Figure 5:
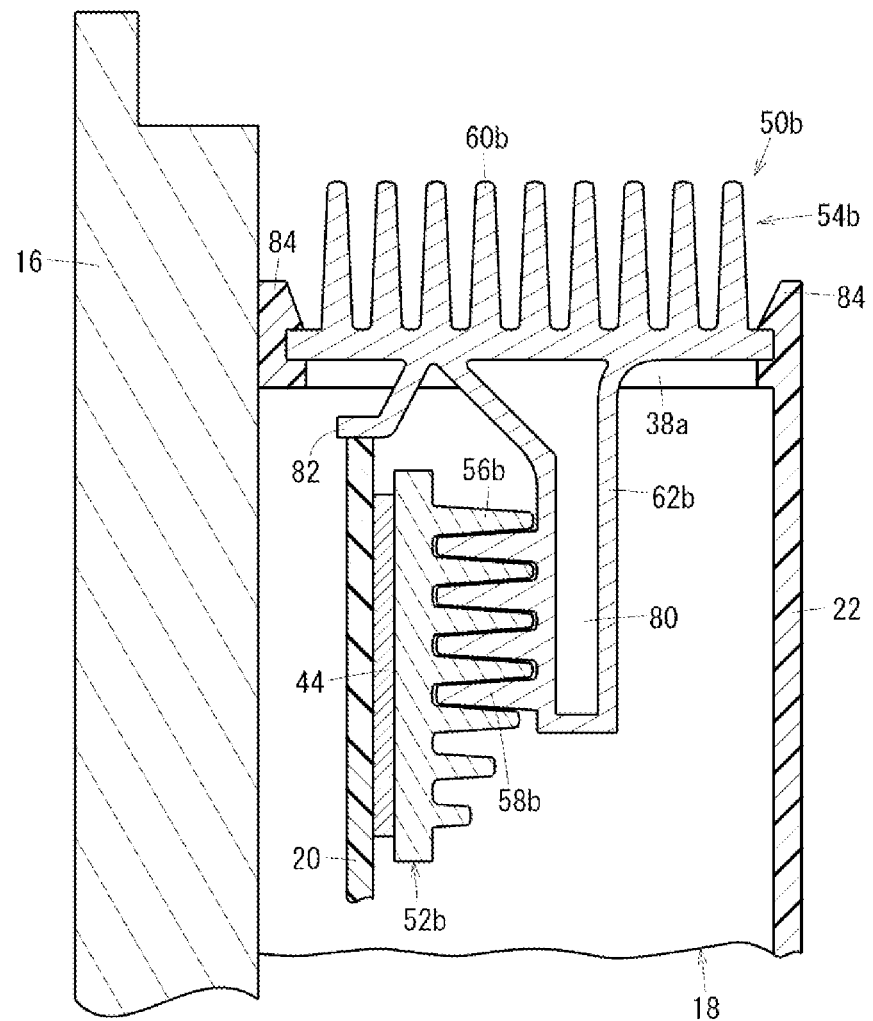
FIG. 5 is a schematic side cross-sectional view of principal components of an electronic device in which a cooling structure according to a first modification is provided.

FIG. 5 is a schematic side cross-sectional view of principal components of an electronic device 12 in which a cooling structure 50b according to a first modification is provided. The cooling structure 50b includes internal heat dissipating fins 52b having a first heat dissipating member 56b, and external heat dissipating fins 54b having a heat input blade member 58b, a heat transfer part 62b, and a second heat dissipating blade member 60b. In addition, a heat pipe 80 is provided in the heat transfer part 62b, together with a leg part 82 projecting out from a flat bottom end portion of the second heat dissipating blade member 60b and abutting against the printed circuit board 20.

Since the heat pipe 80 is provided in the heat transfer part 62b, the speed at which heat is moved from the heat input blade member 58b to the second heat dissipating blade member 60b via the heat transfer part 62b becomes greater. Accordingly, heat from the printed circuit board 20 can be removed with greater efficiency. The heat pipe 80, for example, can be constituted from an enclosed inner space that is formed in the interior of the heat transfer part 62b.

Further, the leg part 82 that projects out from the lower end surface of the external heat dissipating fins 54b is placed in abutment against the printed circuit board 20. Therefore, the weight of the external heat dissipating fins 54b itself or the external force also is distributed to the printed circuit board 20. Consequently, the weight or the external force can be alleviated more effectively.

Furthermore, according to the first modification, the external heat dissipating fins 54b are mounted on the casing 22 through snap fits 84. In this manner, mounting of the external heat dissipating fins 54b on the casing 22 is not limited to being performed with installation screws 66, and configurations other than installation screws 66 may be adopted.

Figure 6:
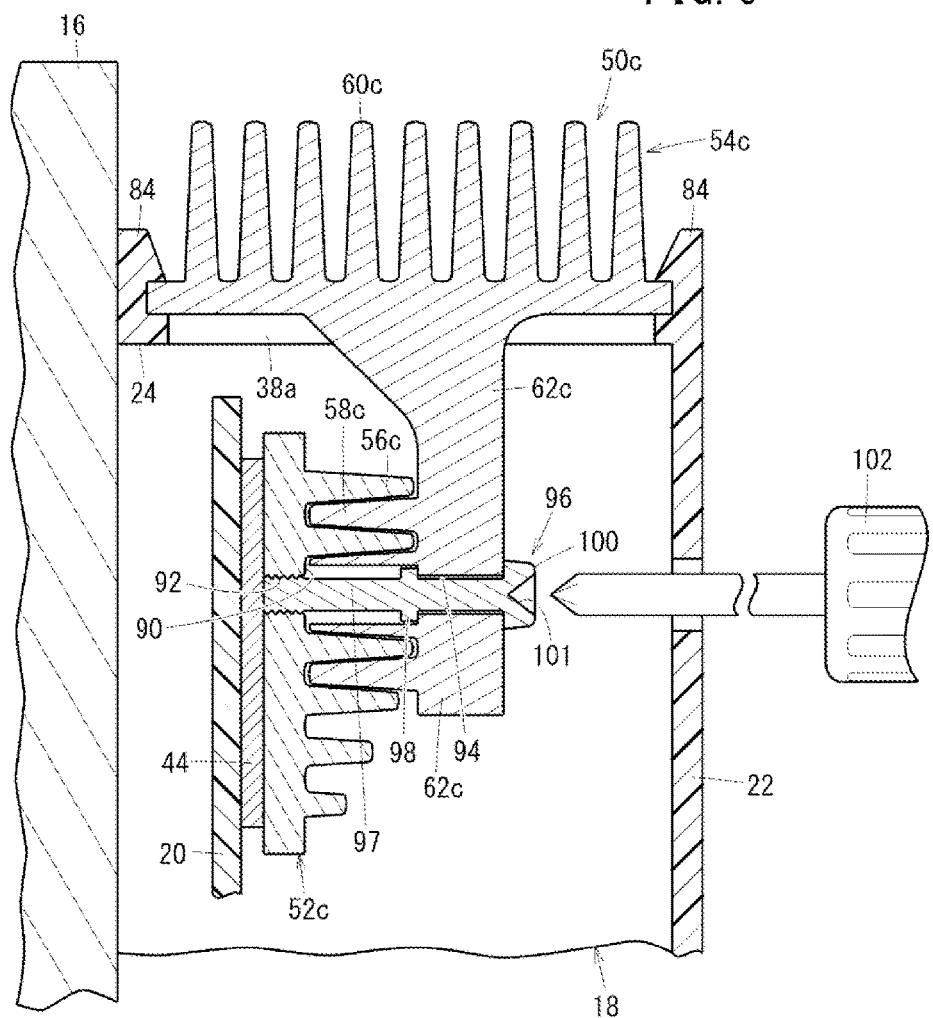
FIG. 6 is a schematic side cross-sectional view of principal components of an electronic device in which a cooling structure according to a second modification is provided.
Figure 7:
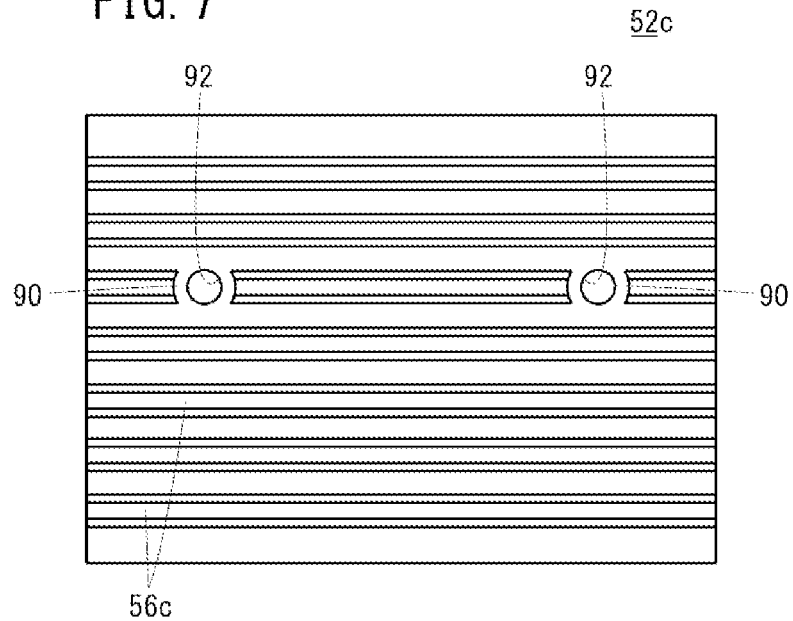
FIG. 7 is a front view of internal heat dissipating fins as viewed from a rear side of a display constituting the electronic device.
Figure 8:
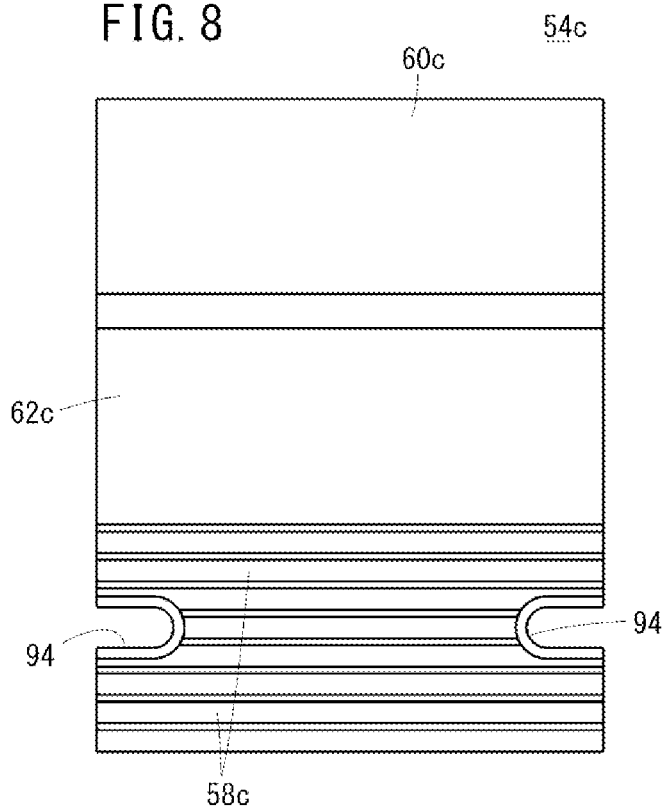
FIG. 8 is a front view of external heat dissipating fins as viewed from a front side of a display constituting the electronic device.

FIG. 6 is a schematic side cross-sectional view of principal components of an electronic device 12 in which a cooling structure 50c according to a second modification is provided, FIG. 7 is a front view of internal heat dissipating fins 52c as viewed from a rear side of the display 16, and FIG. 8 is a front view of external heat dissipating fins 54c as viewed from a front side of the display 16. With such a cooling structure 50c, portions of the first heat dissipating blade member 56c of the internal heat dissipating fins 52c are cutout, and two circular flat parts 90 are formed therein, together with female screw threads 92 being engraved in the circular flat parts 90. Furthermore, in the external heat dissipating fins 54c having the second heat dissipating blade member 60c, two U-shaped grooves 94 are formed by cutting out portions of the heat input blade member 58c.

According to the second modification, the heat input blade member 58c and the first heat dissipating blade member 56c are connected through flange-equipped screws 96 (see FIG. 6) which serve as mounting screws. More specifically, diametrically outward projecting large diameter flanges 98 are included on shank portions 97 of the flange-equipped screws 96, and a portion between the flanges 98 and head portions 100 is inserted into the U-shaped grooves 94. In this state, by rotating a screwdriver 102 that is inserted into screw grooves 101 of the head portions 100, male screw members formed on distal ends of the shank portions 97 are screw-engaged with the female screw threads 92. Due to such screw-engagement, the first heat dissipating blade member 56c and the heat input blade member 58c are rigidly connected to each other in further close contact. Consequently, heat input (transfer of heat) is carried out more at an increased speed from the first heat dissipating blade member 56c to the heat input blade member 58c.

For example, when the casing 22 is detached from the display 16 in order to perform maintenance and inspection work, the internal heat dissipating fins 52c and the external heat dissipating fins 54c are separated from each other. For this purpose, the flange-equipped screws 96 may be rotated in a direction to cause the male screw members to separate away from the female screw threads 92.

Accompanying separation of the male screw members away from the female screw threads 92, the flanges 98 press the heat input blade member 58c and the heat transfer part 62c toward the side of the head portions 100. Therefore, since the heat input blade member 58c is pressed in a direction away from the first heat dissipating blade member 56c, the state of fitted engagement between the first heat dissipating blade member 56c and the heat input blade member 58c can quickly be released. As a result, the internal heat dissipating fins 52c and the external heat dissipating fins 54c separate mutually away from each other.

In the foregoing manner, the flange-equipped screws 96 function as a means for ensuring close and intimate contact of the heat input blade member 58c with the first heat dissipating blade member 56c. Further, at the time that the internal heat dissipating fins 52c and the external heat dissipating fins 54c are made to separate mutually away from each other, the flanges 98 of the flange-equipped screws 96 function as a separation means adapted to press the heat input blade member 58c. Consequently, it is possible to more efficiently remove heat from the printed circuit board 20, together with enabling the state of fitted engagement between the first heat dissipating blade member 56c and the heat input blade member 58c to be quickly and easily released.

Figure 9:
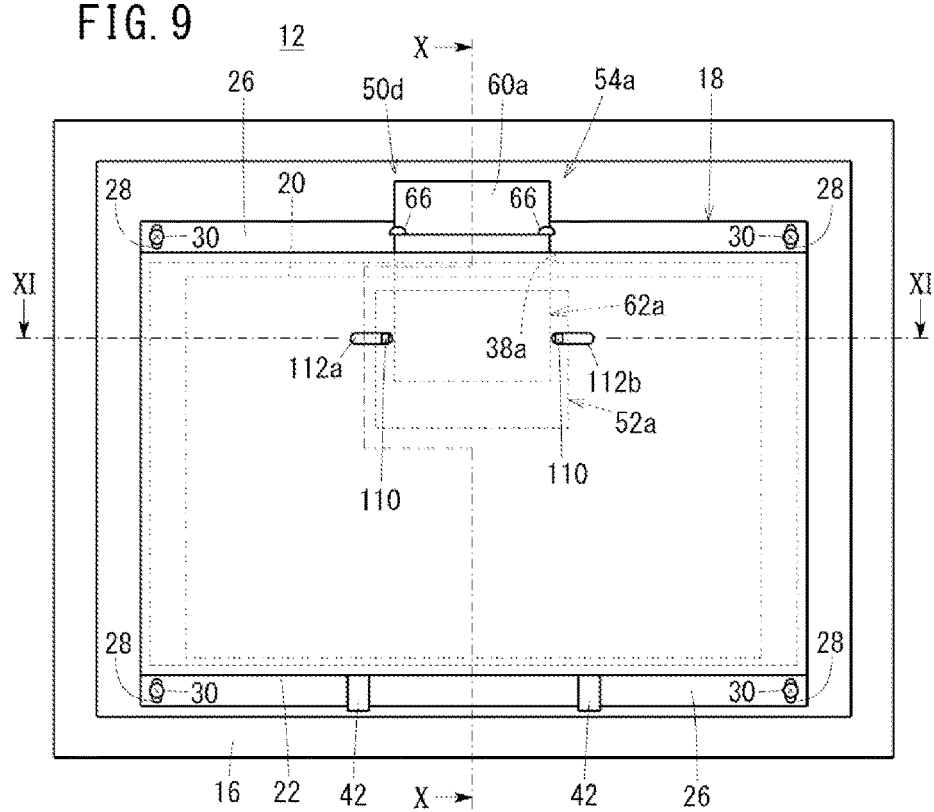
FIG. 9 is a schematic rear view of an electronic device in which a cooling structure according to a third modification is provided.
Figure 10:
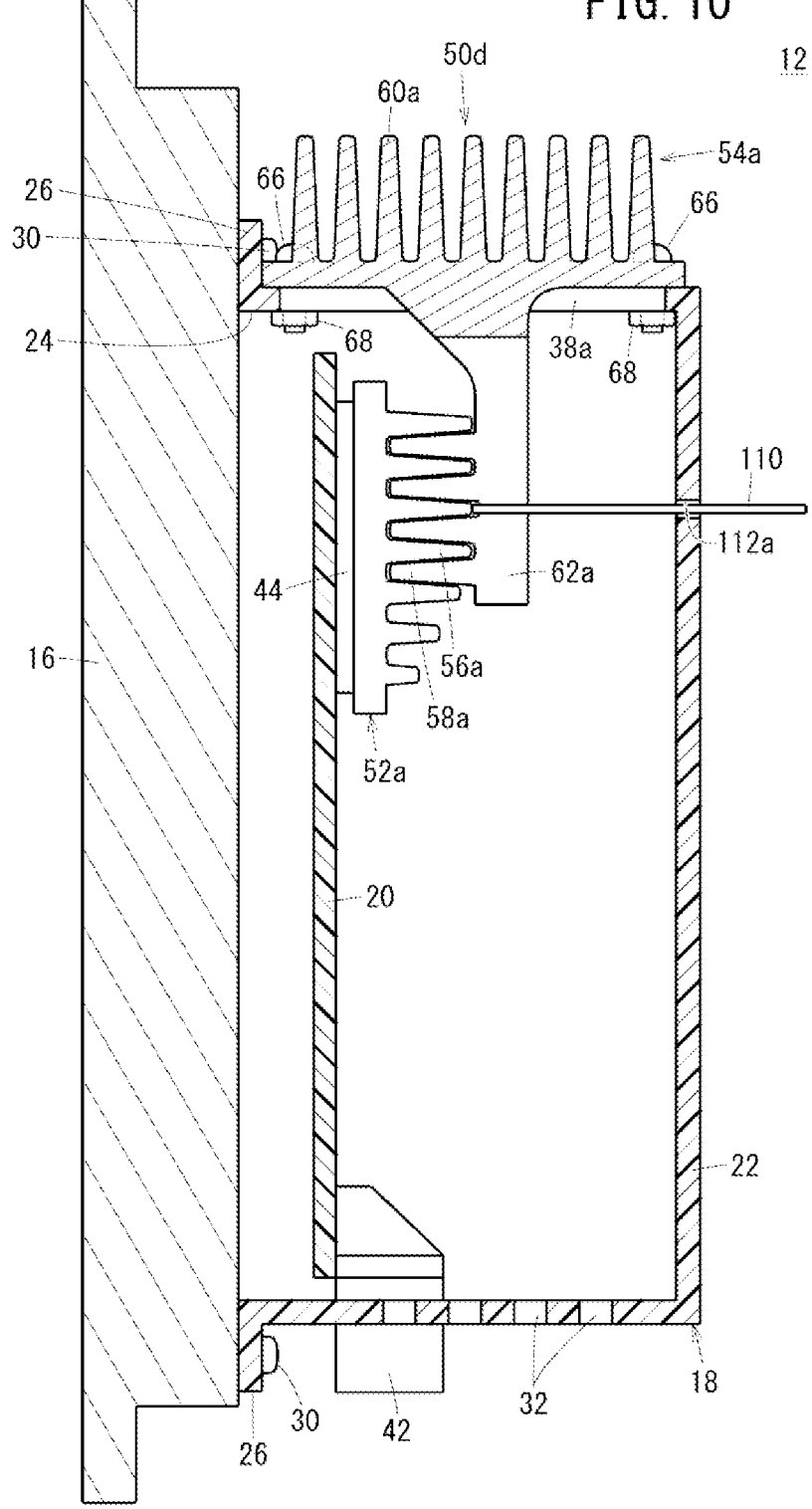
FIG. 10 is a cross-sectional view taken along line X-X in FIG. 9.
Figure 11:
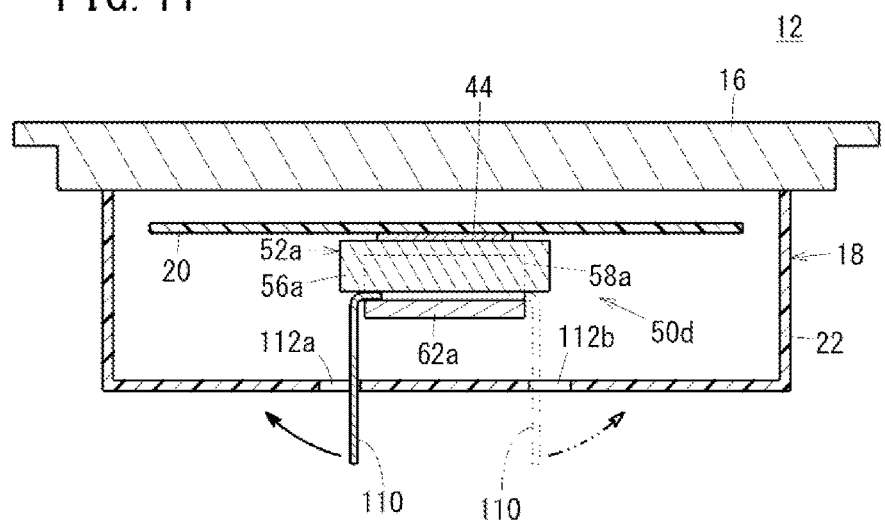
FIG. 11 is a cross-sectional view taken along line XI-XI in FIG. 9.

FIGS. 9 through 11, respectively, are a schematic rear view, a cross-sectional view taken along line X-X in FIG. 9, and a cross-sectional view taken along line XI-XI in FIG. 9 of an electronic device 12 in which a cooling structure 50d according to a third modification is provided. According to the third modification, an L-shaped wrench 110 (lever member) is adopted as a means for facilitating detachment.

More specifically, as shown in FIG. 10, at least one of a blade the height of which is smaller than the others is provided on the first heat dissipating blade member 56a, or a valley the depth of which is greater than the others is provided on the heat input blade member 58a. When the first heat dissipating blade member 56a and the heat input blade member 58a are fitted together, a slight gap is formed between the crest of the blade of the first heat dissipating blade member 56a and the bottom portion of the valley of the heat input blade member 58a. As shown in FIG. 11, a short part of the L-shaped wrench 110 is inserted into the gap. The short part of the L-shaped wrench 110 is placed in abutment with the crest of the blade of the first heat dissipating blade member 56a, and the bottom portion of the valley of the heat input blade member 58a. Alternatively, the short part may be separated slightly therefrom.

Moreover, two elongate operation holes 112a, 112b are formed in the rear surface of the casing 22 (see FIG. 9). A distal end of the long portion of the L-shaped wrench 110 is passed through either one of the elongate operation holes 112a, 112b. More specifically, the distal end of the long portion of the L-shaped wrench 110 is exposed from the elongate operation holes 112a, 112b.

When the casing 22 is detached from the display 16 in order to perform maintenance and inspection work, the distal end of the long portion of the L-shaped wrench 110, which is exposed from the elongate operation hole 112a, is pressed so as to move along the direction of extension (outwardly of the casing 22) of the elongate operation hole 112a. Accompanying pressing and movement thereof, as shown by the arrow in FIG. 11, the long portion is inclined in a direction toward the interior of the casing 22. On the other hand, the short part is inclined toward the exterior of the casing 22.

At this time, the short part presses the bottom portion of the valley of the heat input blade member 58a about an abutment location with respect to the crest of the blade of the first heat dissipating blade member 56a. As a result of such a pressing action, the heat input blade member 58a moves in a direction to cause the heat input blade member 58a to separate away from the first heat dissipating blade member 56a. Therefore, with the third modification as well, the heat input blade member 58a is pressed in a direction away from the first heat dissipating blade member 56a, and as a result, the state of fitted engagement between the first heat dissipating blade member 56a and the heat input blade member 58a is quickly released, and the internal heat dissipating fins 52a and the external heat dissipating fins 54a separate mutually away from each other.

As necessary, the L-shaped wrench 110 may be pulled out from the elongate operation hole 112a, and next, the L-shaped wrench 110 may be inserted from the elongate operation hole 112b, and the short part thereof may be inserted into the gap. Thereafter, the operations described above may be performed. Of course, L-shaped wrenches 110 may be inserted simultaneously from each of the elongate operation holes 112a, 112b, and short parts thereof may be inserted into the gap, whereupon the operations described above may be performed.

Figure 12:
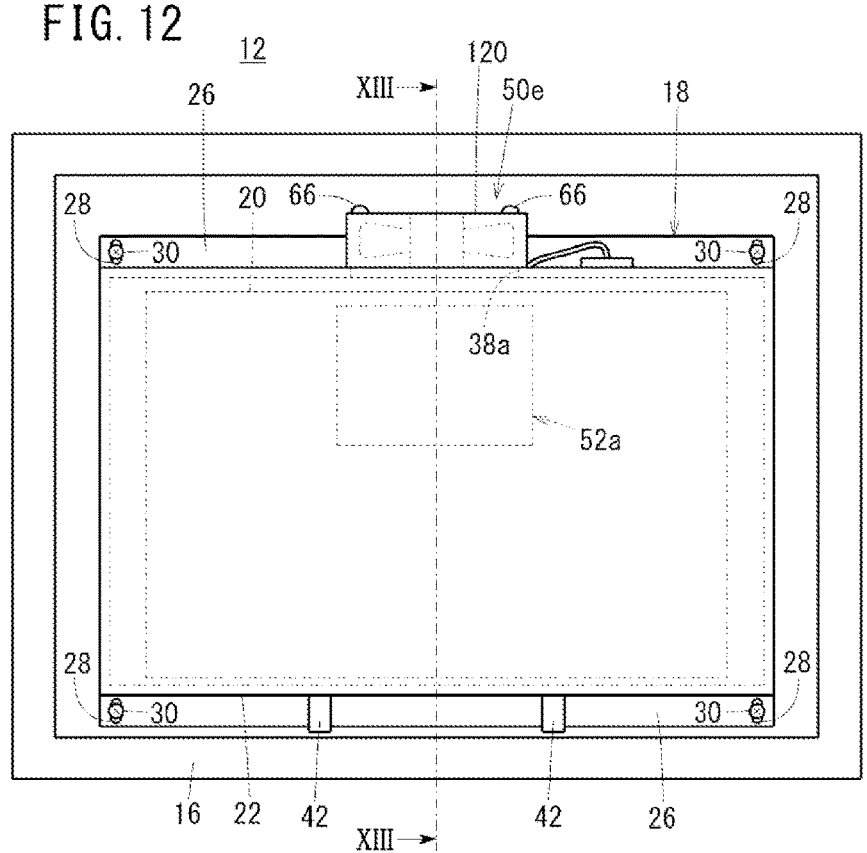
FIG. 12 is a schematic rear view of an electronic device in which a cooling structure according to a fourth modification is provided.
Figure 13:
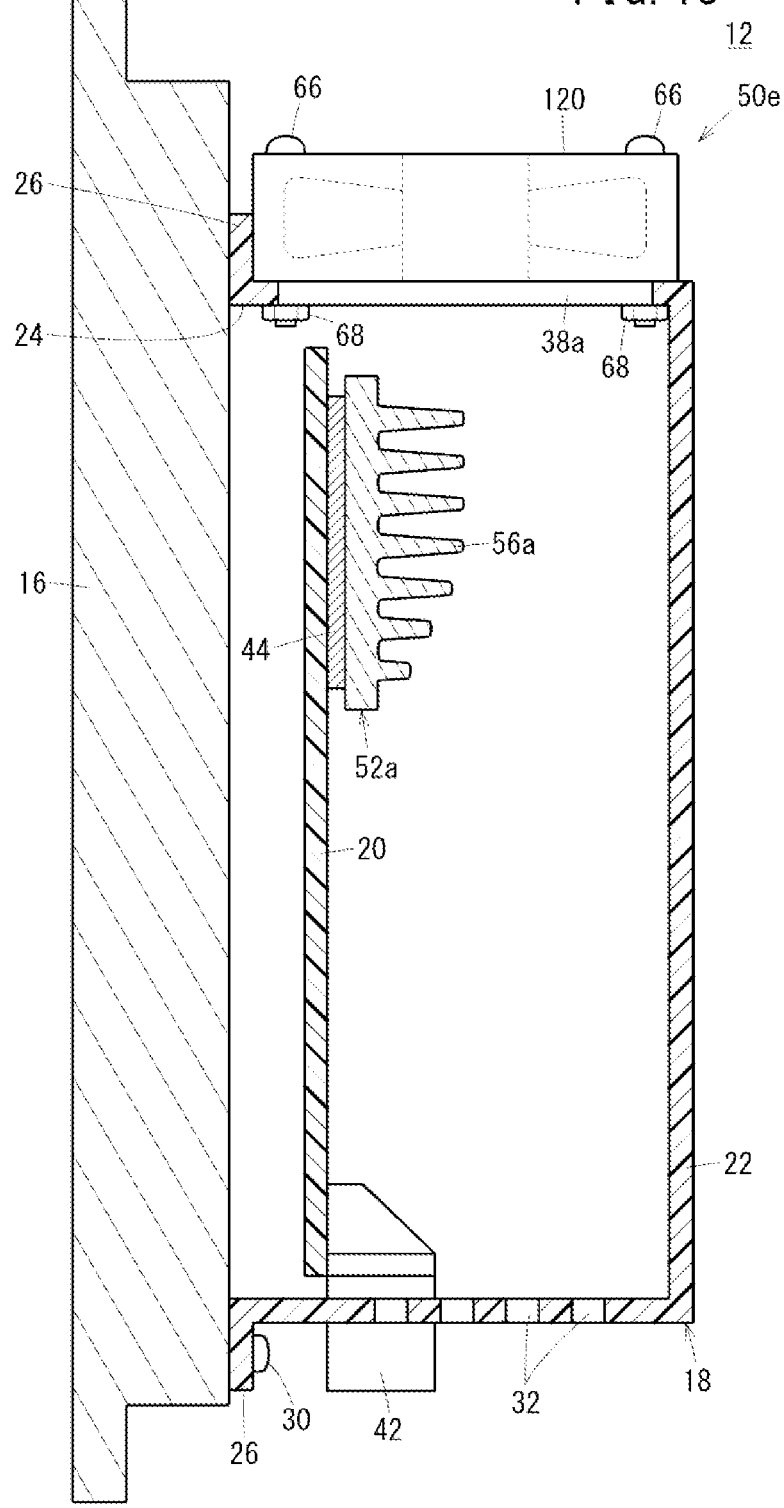
FIG. 13 is a cross-sectional view taken along line XIII-XIII in FIG. 12.
Figure 14:
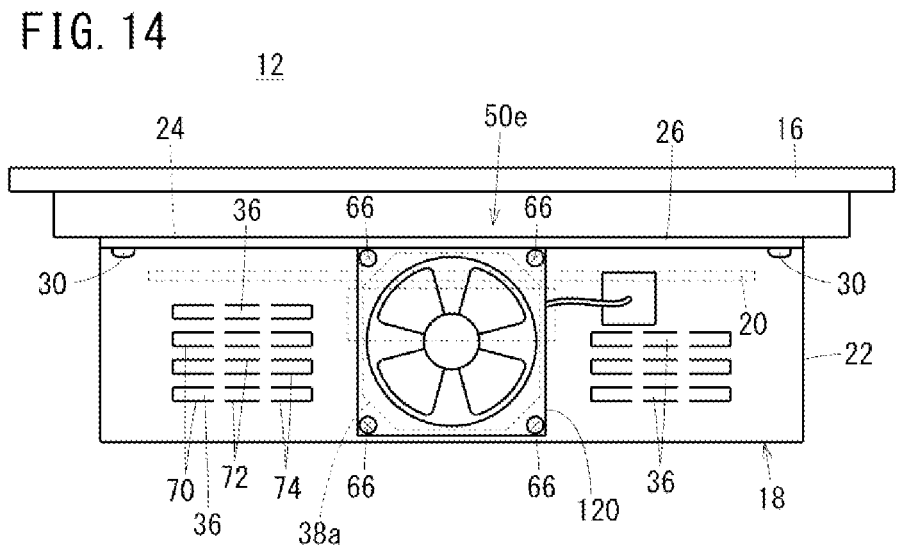
FIG. 14 is a schematic plan view of the electronic device of FIG. 12.

FIGS. 12 through 14, respectively, are a schematic rear view, a cross-sectional view taken along line XIII-XIII in FIG. 12, and a schematic plan view of an electronic device 12 in which a cooling structure 50e according to a fourth modification is provided. According to the fourth modification, instead of the external heat dissipating fins 54a, a cooling fan 120, which is lighter in weight than the external heat dissipating fins 54a, is attached to the casing 22.

In the same manner as the external heat dissipating fins 54a, the cooling fan 120 is installed via installation screws 66 on the upper surface of the casing 22. More specifically, screw insertion holes (not shown) are formed in the four corners of the cooling fan 120, and nuts 68 are screw-engaged onto the installation screws 66 which have been passed through each of the insertion holes and the installation screw holes of the casing 22. In this manner, by rotating the cooling fan 120 which has been mounted on the casing 22, air inside the casing 22 passes through the installation hole 38a and the cooling fan 120, and is discharged to the exterior of the casing 22.

In the foregoing manner, by enabling the external heat dissipating fins 54a to be removed from the casing 22, the means for dissipating heat can suitably be changed. More specifically, a desired type of heat dissipating means can be installed in the casing 22 in accordance with the amount of heat to be dissipated, and a reduction in weight of the electronic device 12.

As noted above, when the cooling fan 120 is rotated, the air in the interior of the casing 22 passes through the cooling fan 120 and is discharged to the exterior. Since the cooling fan 120 is installed on the upper surface of the casing 22, an ascending airflow occurs inside the casing 22. In this instance, according to the fourth modification, the projecting length of the blades that constitute the first heat dissipating blade member 56a is set to be greater on a vertical upper side than on a vertical downward side of the first heat dissipating blade member 56a. Accordingly, a portion of the airflow comes into contact with the lower blades, whereas a remainder thereof goes up and comes into contact with the upper blades. Consequently, the airflow comes into contact over the entirety of the first heat dissipating blade member 56a and is cooled thereby.

In this manner, by making the projecting lengths on the lower side and the upper side differ respectively, in particular when the cooling fan 120 is installed, it is possible for the rising air flow to come into contact with the entirety of the first heat dissipating blade member 56*a*. Consequently, since the first heat dissipating blade member 56*a* can easily be cooled, in this case as well, it is possible for the heat from the printed circuit board 20 to be quickly removed.

Further, according to the fourth modification, the removable parts 36 remain in place without being removed. In this manner, whether or not the upper surface side ventilation openings 34 are formed therein can be selected depending on whether or not the removable parts 36 are removed. Accordingly, the number of upper surface side ventilation openings 34 can be set corresponding to the amount of heat to be dissipated.

Next, a second embodiment in relation to a structure for placement of a heat dissipating member on a rear surface will be described. Structural elements which are the same or correspond to the structural elements described above in relation to the first embodiment are referred to with the same nomenclature, and detailed description of such features is omitted.

Figure 15:
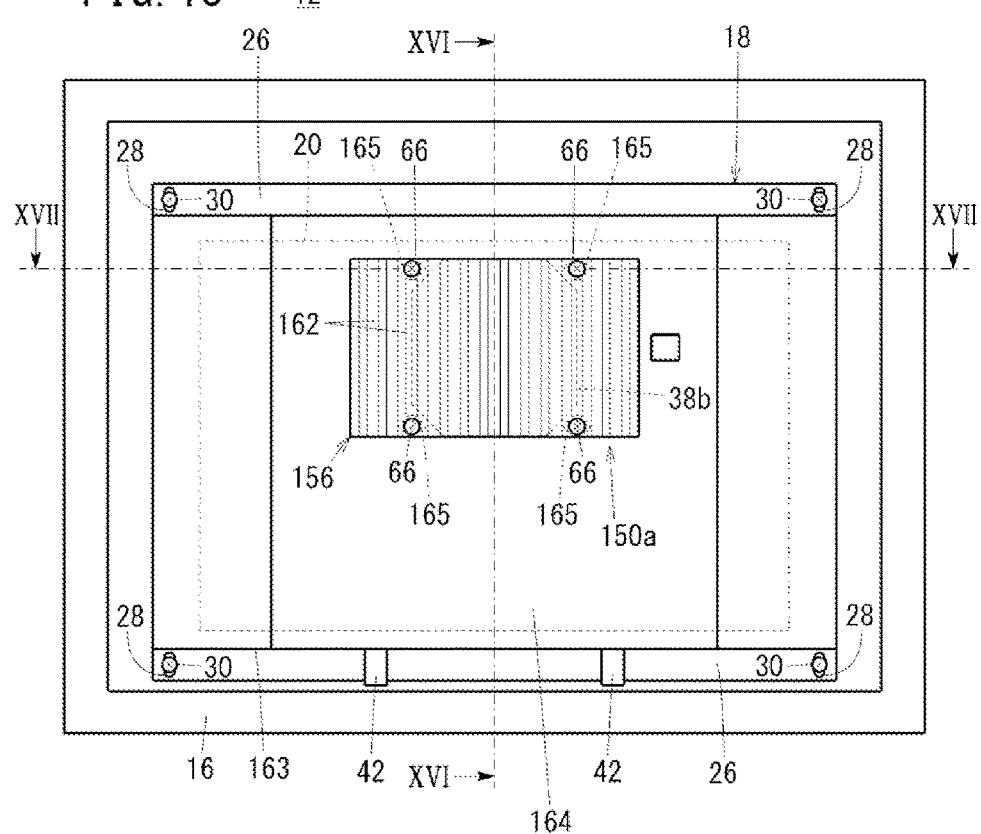
FIG. 15 is a rear view of an electronic device in which a cooling structure according to a second embodiment is provided.
Figure 16:
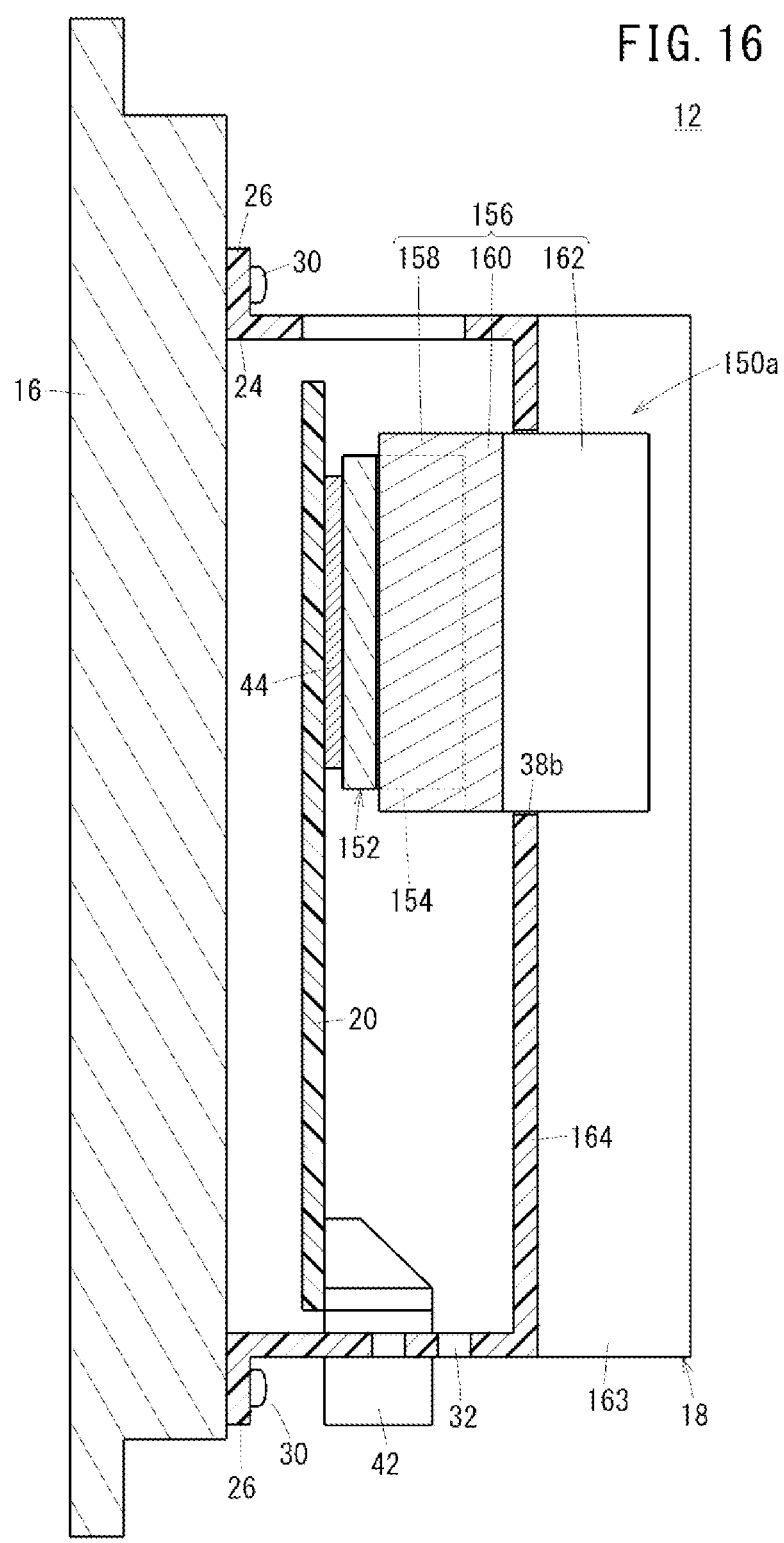
FIG. 16 is a cross-sectional view taken along line XVI-XVI in FIG. 15.
Figure 17:
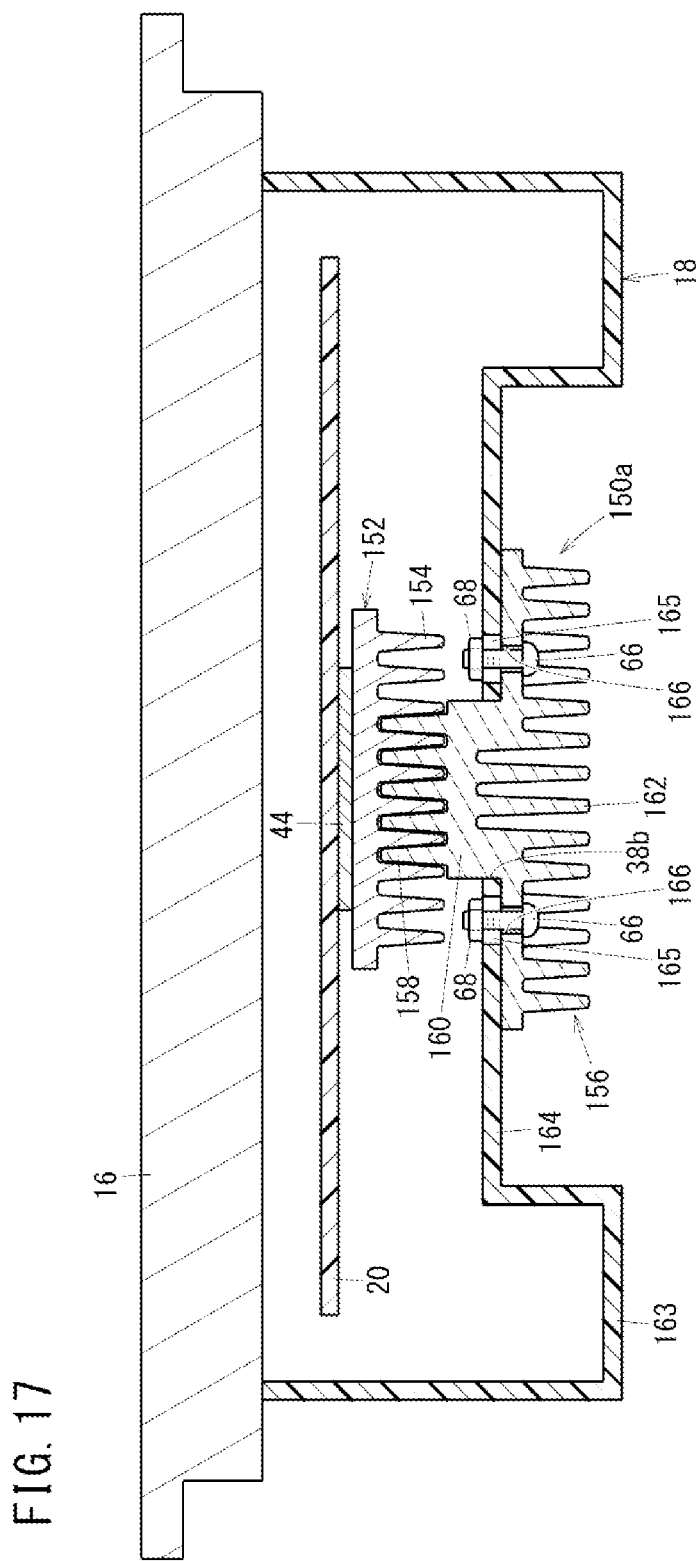
FIG. 17 is a cross-sectional view taken along line XVII-XVII in FIG. 15.

FIGS. 15 through 17, respectively, are a rear view, a cross-sectional view taken along line XVI-XVI in FIG. 15, and a cross-sectional view taken along line XVII-XVII in FIG. 15 of an electronic device 12 in which a cooling structure 150*a* according to a second embodiment is provided. In this case, a first heat dissipating blade member 154 of the internal heat dissipating fins 152 extends along a vertical direction. On the other hand, concerning the external heat dissipating fins 156, a heat input blade member 158, a heat transfer part 160, and a second heat dissipating blade member 162 are aligned in a linear manner, together with the heat input blade member 158 and the second heat dissipating blade member 162 extending along a vertical direction.

According to the second embodiment, a substantially rectangular shaped installation hole 38*b* is formed in a rear surface of the casing 163. The width dimension of the installation hole 38*b* is substantially equivalent to the width dimension of the heat transfer part 160, yet is set to be smaller than the width dimension of the second heat dissipating blade member 162. Consequently, when the heat input blade member 158 and the heat transfer part 160 are passed in this order from the rear surface side of the casing 163, the second heat dissipating blade member 162 is blocked by the casing 163. The external heat dissipating fins 156 are accommodated in a stepped part 164, which is formed in the casing 163 and recessed in a concave shape toward the internal heat dissipating fins 152.

In the vicinity of the installation hole 38*b*, four elongate mounting holes 165 (elongate holes), which serve as position adjusting members, are formed to penetrate at positions distributed in the shape of a rectangle, and extend along a horizontal direction. Further, four penetrating holes 166 are formed in the second heat dissipating blade member 162. Nuts 68 are screw-engaged with male screw portions of the installation screws 66, which have been passed through the penetrating holes 166 and the elongate mounting holes 165.

In this case, by moving the insertion positions of the installation screws 66 with respect to the elongate mounting holes 165 of the casing 163, the mounting position of the external heat dissipating fins 156 with respect to the rear surface of the casing 163 can be adjusted in a horizontal direction. As a result, in the same manner as the first embodiment, by adjusting the relative positioning of the first heat dissipating blade member 154 and the heat input blade member 158, positioning and alignment of both of the blade members 154, 158 can be carried out with high precision.

In the second embodiment as well, the first heat dissipating blade member 154, the heat input blade member 158, and the second heat dissipating blade member 162 preferably extend along the same direction (in this case, the vertical direction). Consequently, manufacturing of the internal heat dissipating fins 152 and the external heat dissipating fins 156, and fitted engagement of the first heat dissipating blade member 154 and the heat input blade member 158 can easily be performed.

Further, with this configuration as well, in the same manner as the first embodiment, heat from the printed circuit board 20 is transmitted to the second heat dissipating blade member 162 from the first heat dissipating blade member 154 via the heat transfer part 160, and thereafter, is further dispersed to the exterior of the casing 163. As a result, the heat from the printed circuit board 20 can quickly be removed. In other words, with the second embodiment, the same advantageous effects as those of the first embodiment are obtained.

Figure 18:
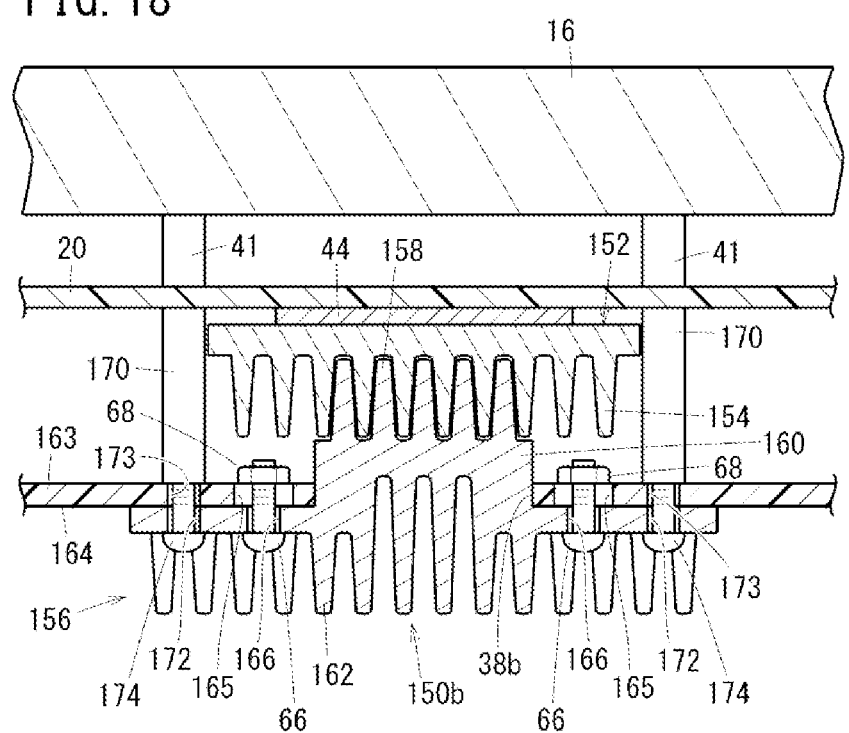
FIG. 18 is a schematic horizontal cross-sectional view of principal components of an electronic device in which a cooling structure according to a fifth modification is provided.

Next, a description will be made concerning modifications of the second embodiment. FIG. 18 is a schematic horizontal cross-sectional view of principal components of an electronic device 12 in which a cooling structure 150*b* according to a fifth modification is provided. With such a cooling structure 150*b*, two support bars 170 (support members) are disposed in the interior of the casing 163.

More specifically, the support bars 170 are disposed on the printed circuit board 20 at positions where the printed circuit board 20 is sandwiched between the support bars 170 and the support pedestals 41 disposed on the rear surface of the display 16. The support bars 170 extend to the casing 163, together with the distal end surfaces thereof being placed in abutment against an inner surface of the casing 163. Non-illustrated female screw threads are engraved in the distal end surfaces of the support bars 170. On the other hand, a plurality of individual screw insertion holes 172, 173 are formed respectively in the external heat dissipating fins 156 and the casing 163. Support screws 174, which are passed through the screw insertion holes 172, 173, are screw engaged in the female screw threads.

As a result, the external heat dissipating fins 156 are also supported by the support bars 170. Therefore, when an external force acts on the external heat dissipating fins 156, the support bars 170 receive and bear the external force. More specifically, since the external force is distributed to the support bars 170, it is possible for the external force to be alleviated more effectively.

Figure 19:
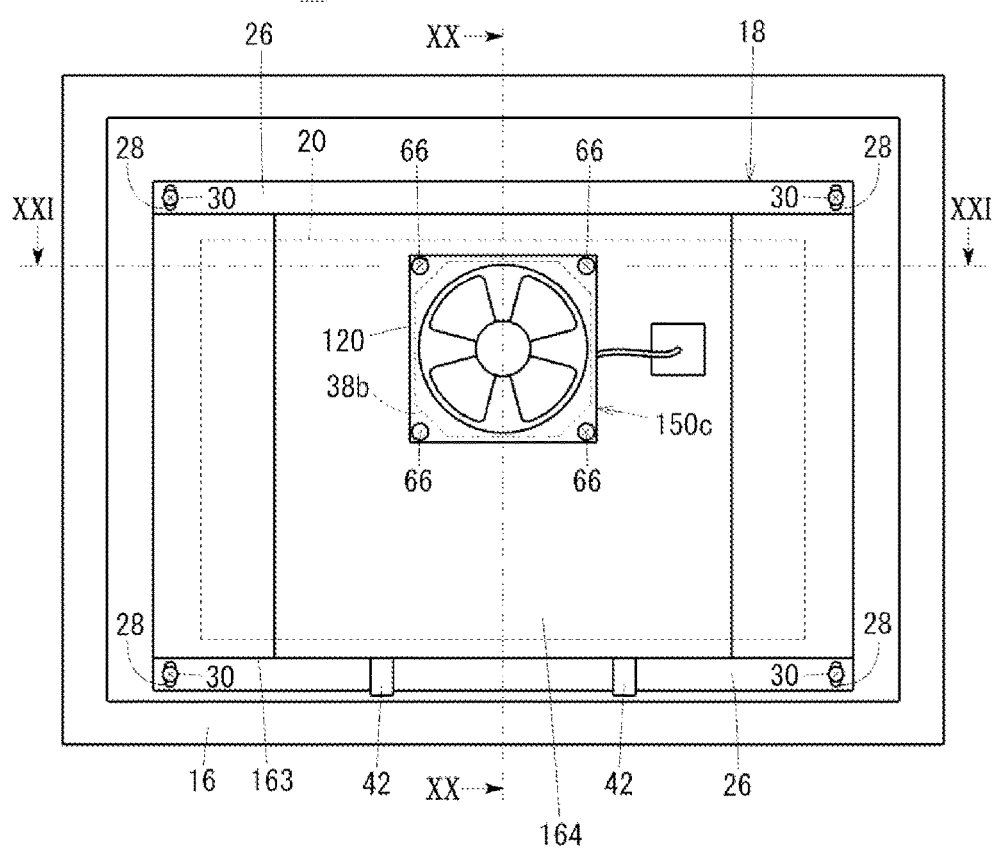
FIG. 19 is a schematic rear view of an electronic device in which a cooling structure according to a sixth modification is provided.
Figure 20:
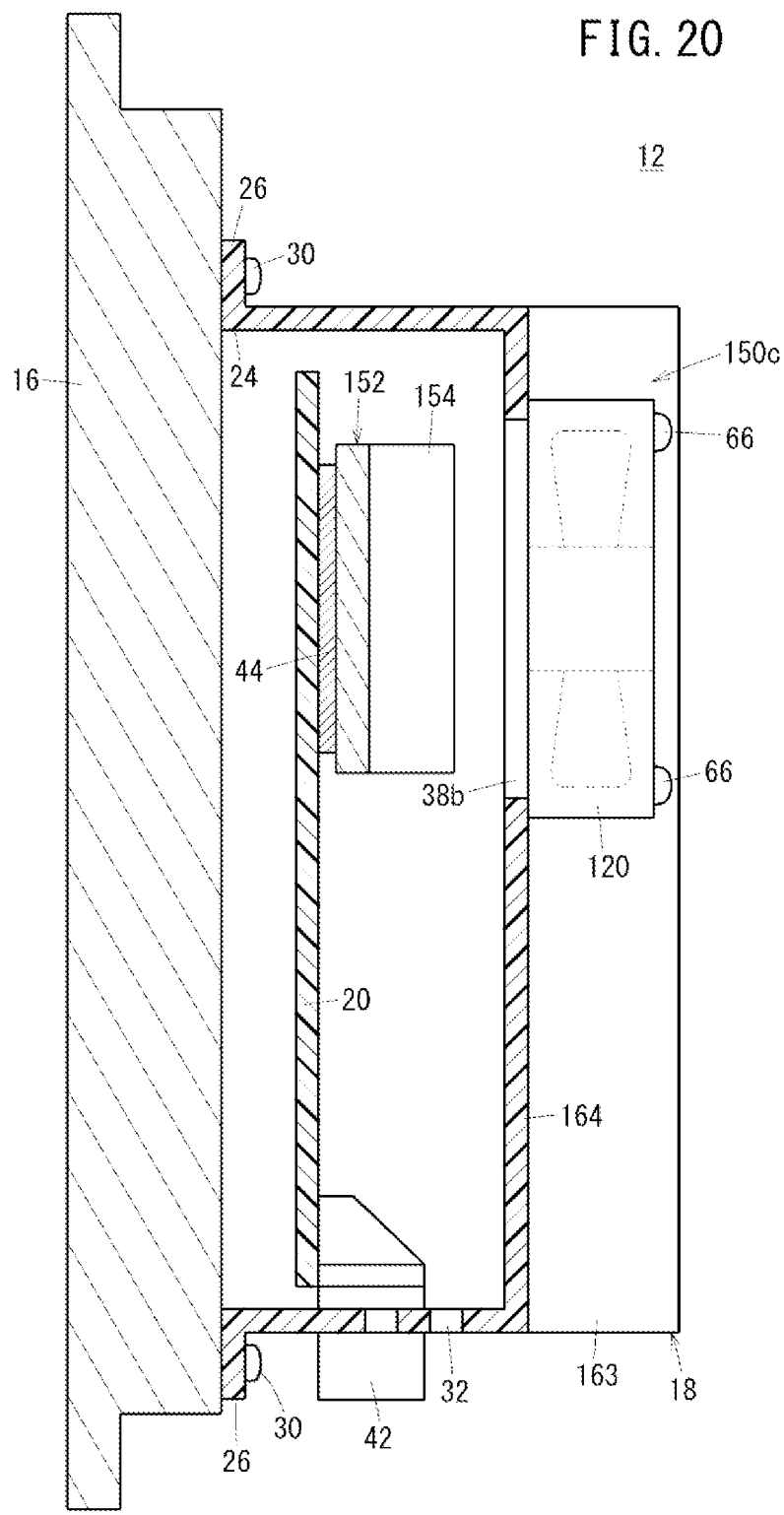
FIG. 20 is a cross-sectional view taken along line XX-XX in FIG. 19.

FIGS. 19 through 21, respectively, are a schematic rear view, a cross-sectional view taken along line XX-XX in FIG. 19, and a cross-sectional view taken along line XXI-XXI in FIG. 19 of an electronic device 12 in which a cooling structure 150*c* according to a sixth modification is provided. In this case, a cooling fan 120 is attached to the casing 163 instead of the external heat dissipating fins 156.

In the same manner as the external heat dissipating fins 156, the cooling fan 120 is installed via installation screws 66 on the rear surface of the casing 163. More specifically, screw insertion holes (not shown) are formed in the four corners of the cooling fan 120, and nuts 68 are screw-engaged onto the installation screws 66 which have been passed through the screw insertion holes and the installation screw holes of the casing 163. In this manner, by rotating the cooling fan 120 which has been mounted on the casing 163, air inside the casing 163 passes through the installation hole 38*b* and the cooling fan 120, and is discharged to the exterior of the casing 163.

In the foregoing manner, by enabling the external heat dissipating fins 156 to be removed from the casing 163, the means for dissipating heat can suitably be changed. More specifically, similar to the fourth modification, a desired type of heat dissipating means can be installed in the casing 163 in accordance with the amount of heat to be dissipated, and a reduction in weight of the electronic device 12.

When the cooling fan 120 is rotated, in the same manner as discussed previously, the air in the interior of the casing 163 passes through the cooling fan 120 and is discharged to the exterior. At this time, an ascending airflow occurs inside the casing 163. According to the sixth embodiment, since the first heat dissipating blade member 154 extends along the vertical direction, the air flow contacts each of the blades thereof substantially equally. Consequently, there is no particular need to make the projecting lengths of the blades different.

The present invention is not particularly limited to the first embodiment and modifications thereof, and the second embodiment and modifications thereof described above, and various changes may be made thereto within a range that does not depart from the essence and gist of the present invention.

For example, it is not particularly necessary to provide the leg part 82 and the heat pipe 80 simultaneously on the external heat dissipating fins 54*b*. Furthermore, in the first embodiment as well, the support bars 170 may be provided inside the casing 22, and the external heat dissipating fins 54*a* may be supported by the support bars 170.

Further, the cooling fan 120 may be disposed by way of the snap fits 84.

What is claimed is:

1. A cooling structure for an electronic device, which is configured to include a first heat dissipating member accommodated inside a casing together with being disposed on a circuit substrate, and a second heat dissipating member adapted to dissipate heat transmitted from the first heat dissipating member to the exterior of the casing, wherein:
   the first heat dissipating member includes a first heat dissipating blade member; and
   the second heat dissipating member includes a heat input blade member which is fitted into, and in direct contact with, the first heat dissipating blade member, a second heat dissipating blade member which is exposed externally of the casing, and a heat transfer part interposed between the heat input blade member and the second heat dissipating blade member, and which is adapted to transmit heat from the heat input blade member to the second heat dissipating blade member.

2. The cooling structure for an electronic device according to claim 1, wherein blades of the first heat dissipating blade member extend in a horizontal direction.

3. The cooling structure for an electronic device according to claim 2, wherein a projecting length of the blades of the first heat dissipating blade member is set to be greater in a vertical upward location than in a vertical downward location of the first heat dissipating blade member.

4. The cooling structure for an electronic device according to claim 1, wherein the first heat dissipating blade member, the heat input blade member, and the second heat dissipating blade member extend in the same direction.

5. The cooling structure for an electronic device according to claim 1, wherein the second heat dissipating member is supported by the casing.

6. The cooling structure for an electronic device according to claim 5, further comprising:
   a position adjusting member which is provided in the casing and configured to change a relative positioning of the second heat dissipating member with respect to the first heat dissipating member.

7. The cooling structure for an electronic device according to claim 1, further comprising:
   a removable part provided in the casing, to form a ventilation opening in the casing upon removal of the removable part from the casing.

8. The cooling structure for an electronic device according to claim 1, wherein
   the heat input blade member includes a plurality of first fins extending in a first direction from a first end of the heat transfer part toward the first heat dissipating member, and
   the second heat dissipation blade member includes a plurality of second fins extending in a second direction from a second end of the heat transfer part, the second direction transverse to the first direction.

9. The cooling structure for an electronic device according to claim 1, wherein
   the first heat dissipating blade member includes a plurality of fins, and
   the first heat dissipating member further includes:
      at least one flat part in a middle of at least one fin of the plurality of fins, and
      female threads formed in the at least one flat part and configured to be engaged with a screw for fastening the first heat dissipating member to the second heat dissipating member.

10. The cooling structure for an electronic device according to claim 9, wherein
   the heat input blade member includes a U-shaped groove extending inwardly from an edge of the heat input blade member, and
   the U-shaped groove is aligned with the at least one flat part to permit the screw to extend through the heat input blade member for engagement with the female threads of the at least one flat part of the first heat dissipating member.

11. A cooling structure for an electronic device, which is configured to include a first heat dissipating member accommodated inside a casing together with being disposed on a circuit substrate, and a second heat dissipating member adapted to dissipate heat transmitted from the first heat dissipating member to the exterior of the casing, wherein:
   the first heat dissipating member includes a first heat dissipating blade member; and
   the second heat dissipating member includes a heat input blade member which is fitted into, and in direct contact with, the first heat dissipating blade member, a second heat dissipating blade member which is exposed externally of the casing, and a heat transfer part interposed between the heat input blade member and the second heat dissipating blade member, and which is adapted to transmit heat from the heat input blade member to the second heat dissipating blade member,
   the cooling structure further comprising a detachment tool adapted to press the heat input blade member in a direction to separate and detach the heat input blade member from the first heat dissipating blade member.

12. The cooling structure for an electronic device according to claim 11, further comprising:
   an attachment screw for attaching the second heat dissipating member to the first heat dissipating member,
   wherein the detachment tool is a flange that protrudes outwardly in a diametrical direction of a shank portion of the attachment screw, and is positioned between the first heat dissipating blade member and the heat input blade member.

13. The cooling structure for an electronic device according to claim 11, wherein the detachment tool is a lever member that is inserted between the first heat dissipating blade member and the heat input blade member.

14. The cooling structure for an electronic device according to claim 1, wherein the second heat dissipating member includes a leg part that abuts against the circuit substrate and is supported on the circuit substrate.

15. The cooling structure for an electronic device according to claim 1, further comprising:
a support member provided in an interior of the casing, wherein the second heat dissipating member is supported by the support member.

16. The cooling structure for an electronic device according to claim 1, wherein the heat transfer part comprises a heat pipe.

17. The cooling structure for an electronic device according to claim 1, wherein
the second heat dissipating member is detachable from the casing, and
upon detachment of the second heat dissipating member from the casing, a cooling fan is configured to be disposed on the casing at a placement location of the second heat dissipating member.

18. The cooling structure for an electronic device according to claim 8, wherein
the heat transfer part extends in the second direction from the first end to the second end, and
the second end has a dimension in the first direction greater than that of the first end.

19. The cooling structure for an electronic device according to claim 8, wherein the second direction is perpendicular to the first direction.

20. A cooling structure for an electronic device, the cooling structure comprising:
a first heat dissipating member configured to be accommodated inside a casing together with a circuit substrate, while being disposed on the circuit substrate; and
a second heat dissipating member configured to dissipate heat transmitted from the first heat dissipating member to an exterior of the casing, wherein:
the first heat dissipating member includes a plurality of heat dissipating fins,
the second heat dissipating member includes:
a plurality of first fins configured to be fitted into and interdigitated in direct contact with the plurality of heat dissipating fins of the first heat dissipating member,
a plurality of second fins configured to be exposed outside the casing, and
a heat transfer part extending between and connecting the plurality of first fins and the plurality of second fins, and configured to transmit heat from the plurality of first fins to the plurality of second fins,
the plurality of first fins extends in a first direction from a first end of the heat transfer part toward the first heat dissipating member,
the plurality of second fins extends in a second direction from a second end of the heat transfer part, the second direction transverse to the first direction,
the heat transfer part extends in the second direction from the first end to the second end, and in the first direction, the second end is wider than the first end.

* * * * *